(12) United States Patent
Kornbluh et al.

(10) Patent No.: US 7,557,456 B2
(45) Date of Patent: Jul. 7, 2009

(54) WAVE POWERED GENERATION USING ELECTROACTIVE POLYMERS

(75) Inventors: Roy D. Kornbluh, Palo Alto, CA (US); Ronald E. Pelrine, Longmont, CO (US); Harsha Prahlad, Cupertino, CA (US); Seiki Chiba, Tokyo (JP); Joseph S. Eckerle, Redwood City, CA (US); Bryan Chavez, Palo Alto, CA (US); Scott E. Stanford, Mountain View, CA (US); Thomas Low, Belmont, CA (US)

(73) Assignee: SRI International, Menlo Park, CA (US)

( * ) Notice: Subject to any disclaimer, the term of this patent is extended or adjusted under 35 U.S.C. 154(b) by 248 days.

(21) Appl. No.: 11/684,423

(22) Filed: Mar. 9, 2007

(65) Prior Publication Data

US 2007/0257490 A1 Nov. 8, 2007

Related U.S. Application Data

(60) Provisional application No. 60/797,974, filed on May 5, 2006, provisional application No. 60/852,718, filed on Oct. 18, 2006.

(51) Int. Cl.
*F03B 13/12* (2006.01)
*H02N 3/00* (2006.01)

(52) U.S. Cl. .................. 290/42; 290/53; 310/307

(58) Field of Classification Search ............ 290/42, 290/43, 44, 53, 54, 55; 310/307, 339, 800
See application file for complete search history.

(56) References Cited

U.S. PATENT DOCUMENTS

| | | | |
|---|---|---|---|
| 3,064,137 A | 11/1962 | Corbett, Jr. et al. | |
| 3,546,473 A | 12/1970 | Rich | |
| 3,696,251 A | 10/1972 | Last et al. | |
| 3,783,302 A | 1/1974 | Woodbridge | |
| 4,260,901 A | 4/1981 | Woodbridge | |
| 4,319,454 A | 3/1982 | Lucia | |
| 4,389,843 A | 6/1983 | Lamberti | |
| 4,539,485 A | 9/1985 | Neuenschwander | |
| 4,655,332 A | 4/1987 | Herbulot et al. | |
| 4,718,231 A | 1/1988 | Vides | |
| 4,742,241 A | 5/1988 | Melvin | |
| 4,754,157 A | 6/1988 | Windle | |

(Continued)

FOREIGN PATENT DOCUMENTS

JP 5-253175 10/1993

(Continued)

OTHER PUBLICATIONS

Bar-Cohen, Y., (ed.), Electroactive Polymer (EAP) Actuators as Artificial Muscles-Reality, Potential and Challenges, SPIE Press, Bellingham, Washington, 2001.

(Continued)

*Primary Examiner*—Nicholas Ponomarenko
(74) *Attorney, Agent, or Firm*—Beyer Law Group LLP

(57) ABSTRACT

Described herein are systems and methods that use an electroactive polymer transducer to convert mechanical energy, originally contained in one or more waves, to electrical energy. Marine devices described herein may employ a mechanical energy conversion system that transfers mechanical energy in a wave into mechanical energy suitable for input to the electroactive polymer transducer.

35 Claims, 22 Drawing Sheets

U.S. PATENT DOCUMENTS

| | | |
|---|---|---|
| 5,167,786 A | 12/1992 | Eberle |
| 5,552,657 A | 9/1996 | Epstein |
| 5,696,413 A | 12/1997 | Woodbridge et al. |
| 6,020,653 A | 2/2000 | Woodbridge et al. |
| 6,219,589 B1 | 4/2001 | Faraz et al. |
| 6,291,904 B1* | 9/2001 | Carroll .................. 290/53 |
| 6,392,314 B1 | 5/2002 | Dick |
| 6,545,384 B1 | 4/2003 | Pelrine et al. |
| 6,617,705 B1 | 9/2003 | Smalser |
| 6,628,040 B2* | 9/2003 | Pelrine et al. ............... 310/307 |
| 6,644,027 B1 | 11/2003 | Kelly |
| 6,647,716 B2 | 11/2003 | Boyd |
| 6,731,019 B2 | 5/2004 | Burns |
| 6,768,246 B2* | 7/2004 | Pelrine et al. ............... 310/339 |
| 6,781,284 B1 | 8/2004 | Pelrine et al. |
| 6,791,205 B2 | 9/2004 | Woodbridge |
| 6,809,462 B2 | 10/2004 | Pelrine et al. |
| 6,812,624 B1 | 11/2004 | Pei et al. |
| 6,833,631 B2 | 12/2004 | Van Breems |
| 6,864,592 B1 | 3/2005 | Kelly |
| 6,882,086 B2 | 4/2005 | Kornbluh et al. |
| 7,012,340 B2 | 3/2006 | Yi |
| 7,034,432 B1* | 4/2006 | Pelrine et al. ............... 310/309 |
| 7,064,472 B2* | 6/2006 | Pelrine et al. ............... 310/324 |
| 7,140,180 B2 | 11/2006 | Gerber et al. |
| 7,141,888 B2 | 11/2006 | Sabol et al. |
| 7,164,212 B2 | 1/2007 | Leijon et al. |
| 7,166,953 B2* | 1/2007 | Heim et al. ............... 310/333 |
| 7,199,481 B2 | 4/2007 | Hirsch |
| 7,199,501 B2 | 4/2007 | Pei et al. |
| 7,242,106 B2 | 7/2007 | Kelly |
| 7,259,503 B2* | 8/2007 | Pei et al. .................. 310/363 |
| 7,298,054 B2 | 11/2007 | Hirsch |
| 7,304,399 B2 | 12/2007 | Leijon et al. |
| 7,323,790 B2 | 1/2008 | Taylor et al. |
| 7,362,032 B2* | 4/2008 | Pelrine et al. ............... 310/309 |
| 7,368,862 B2* | 5/2008 | Pelrine et al. ............... 310/365 |
| 7,378,783 B2* | 5/2008 | Pelrine et al. ............... 310/311 |
| 2004/0061338 A1 | 4/2004 | Woodbridge |
| 2004/0064195 A1 | 4/2004 | Herr |
| 2004/0163389 A1 | 8/2004 | Gerber et al. |
| 2004/0239120 A1 | 12/2004 | Yi |
| 2004/0251692 A1 | 12/2004 | Leijon et al. |
| 2005/0235641 A1 | 10/2005 | Sabol et al. |
| 2005/0237775 A1 | 10/2005 | Sabol et al. |
| 2006/0095180 A1 | 5/2006 | Ummethala et al. |
| 2006/0200287 A1 | 9/2006 | Parison et al. |
| 2006/0208839 A1 | 9/2006 | Taylor et al. |
| 2007/0040384 A1 | 2/2007 | Bernhoff et al. |
| 2007/0080539 A1 | 4/2007 | Kelly |
| 2007/0090652 A1 | 4/2007 | Leijon et al. |
| 2007/0132246 A1 | 6/2007 | Hirsch |
| 2007/0158950 A1 | 7/2007 | Crespo |
| 2007/0162152 A1 | 7/2007 | Herr et al. |
| 2007/0257491 A1 | 11/2007 | Kornbluh et al. |
| 2007/0278057 A1 | 12/2007 | Wereley et al. |
| 2008/0015753 A1 | 1/2008 | Wereley et al. |
| 2008/0016860 A1 | 1/2008 | Kornbluh et al. |
| 2008/0156602 A1 | 7/2008 | Hiemenz et al. |
| 2008/0203850 A1* | 8/2008 | Martineau .................. 310/309 |

OTHER PUBLICATIONS

Product Information from Freeplay Energy website, www.freeplayenergy.com, printed Mar. 13, 2008.

Graw, "Shore protection and electricity by submerged plate wave energy converter," European Wave Energy Symposium, Edinburgh, UK, 1993. Available online at www.uni-leipzig.de/~grw/lit/texte_099/14_1993/14_1993_euwen.pdf, 1993.

Hanley, "Off-grid power systems for rural distance education schools," presentation at Village Power Conference Workshop, Sandia National Laboratories, Dec. 4, 2000. Available online at www.rsvp.nrel.gov.

Kornbluh et al., "Electroelastomers: applications of dielectric elastomer transducers for actuation, generation and smart structures," *Smart Structures and Materials 2002: Industrial and Commercial Applications of Smart Structures Technologies*, ed. A. McGowan, Proc. SPIE 4698, pp. 254-270, 2002.

Moretti, "Tension in Fluttering Flags," $23^{rd}$ Oklahoma AIAA/ASME Symposium, University of Oklahoma, Norman, Mar. 8, 2003.

Office Action dated Feb. 11, 2008 in U.S. Appl. No. 11/830,722.

Park et al., "Ultrahigh strain and piezoelectric behavior in relaxor based ferroelectric single crystals," J. Applied Physics 82, pp. 1804-1811, 1997.

Paul, "Quiet, small, lightweight, heavy-fueled mini generator sets for power needs of soldiers and unmanned ground vehicles," 2002. (Available at http://www.asc2002.com/manuscripts/F/FO-05.pdf) Also, for example, information on the performance of a small Cox engine, the commercially available industry standard often used for MAVs can be found at http://www.aero.ufl.edu/~issmo/mav/Morris/morris.htm.

Pelrine et al., "Dielectric Elastomers: Generator Mode Fundamentals and Applications," in *Smart Structures and Materials 2001: Electroactive Polymer Actuators and Devices*, ed. Y. Bar-Cohen, *Proc. SPIE* 4329, pp. 148-156, 2001.

Pelrine et al., "Electrostriction of Polymer Films for Microactuators," The Tenth Annual International Workshop on Micro Electromechanical Systems, IEEE, Nagoya, Japan, pp. 238-243 (Jan. 1997).

Prahlad et al., "Polymer power: Dielectric elastomers and their applications in distributed actuation and power generation," Proceedings of ISSS 2005, International Conference on Smart Materials Structures and Systems, Jul. 28-30, Bangalore, India, 2005.

U.S. Appl. No. 60/894,014, filed on Mar. 9, 2007.

Wax et al., "Electroactive Polymer Actuators and Devices," in Smart Structures and Materials 1999: Electroactive Polymer Actuators and Devices (EAPAD) ed. Bar-Cohen, Proc. SPIE 3369, pp. 2-10, 1999.

Web site on pedal power pack unit developed by Center for Renewable Energy, Nepal, www.namstct.org/pppre.htm.

Xu, "Plastic electronics and future trends in microelectronics," Synthetic Metals 115, Issue 1, pp. 1-3, 2000. Available online at http://netserv.ipc.uni-linz.ac.at/~dieter/DsWeb/Lit/SyM/SyM115(00)1.pdf.

International Search Report dated Feb. 12, 2008 in PCT Application No. PCT/US07/08573.

Written Opinion dated Feb. 12, 2008 in PCT Application No. PCT/US07/08573.

International Search Report dated Feb. 15, 2008 in PCT Application No. PCT/US07/08572.

Written Opinion dated Feb. 15, 2008 in PCT Application No. PCT/US07/08572.

U.S. Appl. No. 12/043,776, filed Mar. 6, 2008.

Office Action dated Aug. 28, 2008 in U.S. Appl. No. 11/830,722.

Office Action dated Nov. 18, 2008 in U.S. Appl. No. 11/684,426.

* cited by examiner

WAVE POWERED GENERATION USING ELECTROACTIVE POLYMERS

CROSS-REFERENCE TO RELATED APPLICATIONS

This application claims priority under 35 U.S.C. §119(e) from a) co-pending U.S. Provisional Patent Application No. 60/797,974 filed May 5, 2006, naming R. Pelrine et al. as inventors, and titled "Wind and Wave Powered Generators Using Electroactive Polymers", and b) co-pending U.S. Provisional Patent Application No. 60/852,718 filed Oct. 18, 2006, naming R. Pelrine et al. as inventors, and titled "Electric Power Generation"; each of these provisional applications is incorporated by reference herein in their entirety for all purposes.

FIELD OF THE INVENTION

The present invention relates generally to electroactive polymer generator devices and methods. More particularly, the present invention relates to the use of electroactive polymers to generate electrical energy from mechanical energy contained in one or more waves.

BACKGROUND OF THE INVENTION

Many marine devices consume electrical power. Buoys for example include onboard lighting and communication systems that constantly rely on an on-board power source.

Batteries are currently used to supply electrical energy to remote marine devices such as buoys. Non-rechargeable batteries inevitably run out of energy, which necessitates inconvenient and costly battery maintenance. Rechargeable batteries need a power source to recharge them.

Waves offer a continuous and ample source of mechanical energy, but harnessing the inconsistent and unpredictable wave energy for conversion into electrical energy has been problematic to date. Most marine devices employ an electromechanical generator for mechanical to electrical energy conversion. Electro-mechanical generators rely on consistent rotary input, which necessitates the use of gearing and linear-to-rotary mechanical transmission systems. These mechanical transmission systems add significant weight, losses and complexity to the marine device. Alternate devices and methods to harness wave power and produce electrical energy in remote marine environments would be beneficial.

SUMMARY OF THE INVENTION

The present invention provides systems and methods that use an electroactive polymer transducer to convert mechanical energy, originally contained in one or more waves, to electrical energy. In one embodiment, marine devices described herein employ a mechanical energy conversion system that transfers mechanical energy in a wave into mechanical energy suitable for input to the electroactive polymer transducer.

In one aspect, the present invention relates to a marine device. The marine device includes a body, a mechanical energy transmission system and an electroactive polymer transducer. The marine device is configured such that a portion of the body rests above a surface level of water when the marine device floats in the water. The mechanical energy transmission system is configured to convert mechanical energy resulting from a change in the water surface level to mechanical energy regulated by the mechanical energy transmission system. The electroactive polymer transducer is operably coupled to a portion of the mechanical energy transmission system and configured to produce electrical energy using the regulated mechanical energy in the mechanical energy transmission system. The electroactive polymer transducer includes an electroactive polymer and at least two electrodes coupled to the electroactive polymer.

In another aspect, the present invention relates to a buoy. The buoy includes a body, a mechanical energy transmission system, an electroactive polymer transducer and a light adapted to use electrical energy produced by the electroactive polymer transducer.

In yet another aspect, the present invention relates to a marine device. The marine device includes a body, a mechanical energy transmission system, an electroactive polymer transducer, and conditioning electronics in electrical communication with the at least two electrodes and designed or configured to add or remove electrical energy from the electroactive polymer transducer.

In still another aspect, the present invention relates to a method of generating electrical energy in a marine device including a body. The method includes floating the marine device. The marine device is configured such that a portion of the body rests above the water surface level when the marine device floats in the water. The method also includes transmitting mechanical energy from a water surface level change to an electroactive polymer transducer. The method further includes generating electrical energy using the electroactive polymer transducer. The electroactive polymer transducer includes an electroactive polymer and at least two electrodes coupled to the electroactive polymer.

These and other features and advantages of the present invention will be described in the following description of the invention and associated figures.

DETAILED DESCRIPTION OF THE PREFERRED EMBODIMENTS

The present invention is described in detail with reference to a few preferred embodiments as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Introduction

This disclosure describes marine devices that include an electroactive polymer transducer that generates electrical energy. Generation occurs in a two-stage process. The first stage translates mechanical energy in a wave, whose displacement and frequency are often inconsistent and unpredictable, to regulated mechanical energy that is better suited for mechanical/electrical conversion by the electroactive polymer transducer. In one embodiment, this mechanical transmission translates the wave mechanical energy into movement of an energy storage mass in one or more known directions, e.g., moving the energy storage mass along a linear slide. In another embodiment, a linear translation mechanism couples relative motion of two different parts of a marine device. For example, wave motion may cause a relative motion between a flotation element and a reaction plate or anchor; this relative displacement then serves as limited and harnessed mechanical input suitable for a generator that receives linear motion as an input. In the second stage, the electroactive polymer transducer converts the regulated mechanical energy into electrical energy. The electrical energy may be used and/or stored for subsequent use, as desired.

Figure 1:
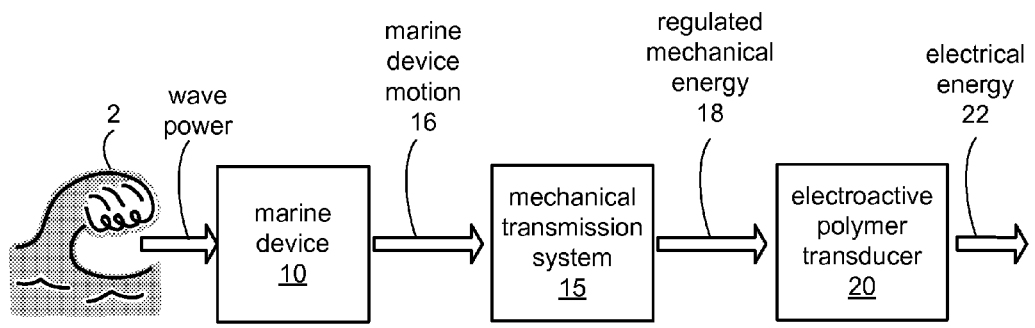
FIG. 1 shows a method overview of wave energy harvesting according to the present invention.
Figure 2:
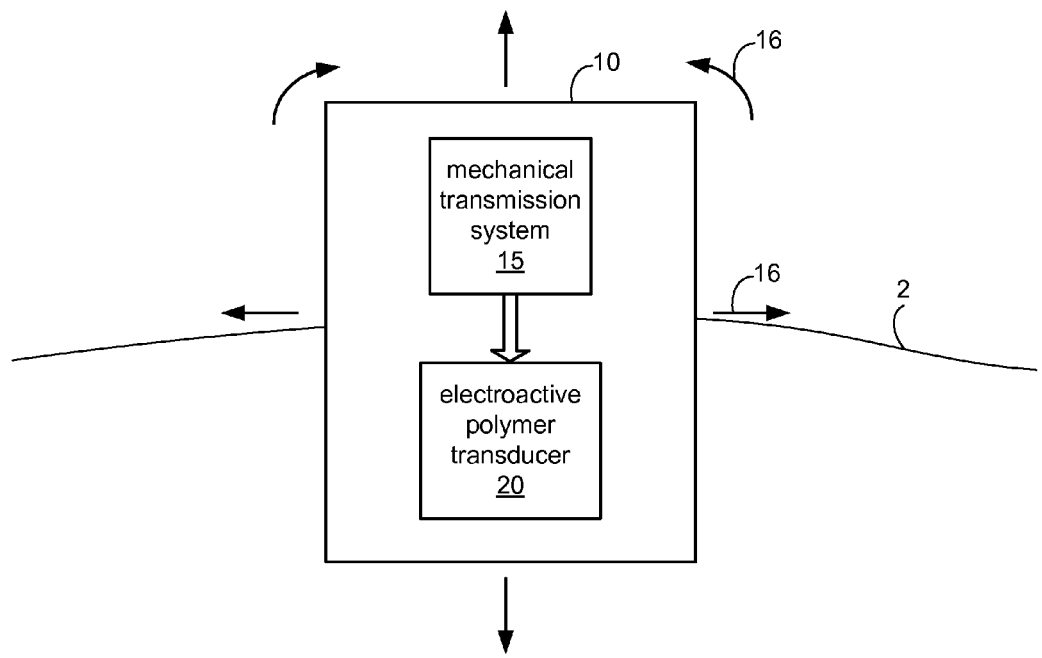
FIG. 2 illustrates a simplified marine device according to one embodiment of the present invention.

FIGS. 1-2 schematically show electrical energy generation according to various embodiments of the present invention. FIG. 1 shows a method overview of wave energy harvesting and electrical energy generation according to one embodiment of the present invention. FIG. 2 illustrates a simplified marine device 10 in accordance with one embodiment of the present invention.

Referring initially to FIG. 1, waves 2 provide an unpredictable and untamed supply of mechanical energy. As the term is used herein, a wave refers to a change in a water surface level. 'Wave energy' refers to mechanical energy, kinetic and/or potential, in a wave. Properties that characterize mechanical energy in a wave include wave height (average peak to trough), wave period, wave direction, and water depth.

Marine device 10 refers to any apparatus or system that is deployed in water and consumes or transmits electrical energy. Many marine devices 10 described herein float on the water such that at least a portion of the device rests above the water surface level. Two particular marine devices 10 will be expanded upon below: a) a marine navigation buoy that includes a generator for powering an onboard lighting system, and b) a floating generator for general production of electrical energy, e.g., for supply onto a grid.

While waves offer significant amounts of energy, particularly in ocean and bay settings, their inconsistency complicates energy harvesting. The movement 16 of a floating marine device 10 relative to the water may change significantly between waves in terms of direction (e.g., upward motion for one wave, followed by angular motion of the device relative to changing water surface levels on a next wave, followed by angular motion in a different direction for a following wave, etc.), amount of motion, wave period (or frequency), etc. Wave properties will also vary with marine environment. Waves in ocean environments are typically low frequency, in the 0.1 to 1.0 Hz range, and relatively high in amplitude (wave heights greater than 1 meter are common).

To tame and harness this input energy inconsistency, marine device 10 includes a mechanical energy transmission system 15 that is configured to convert mechanical energy in a wave (and irregular movement 16 of device 10 relative to the water surface 2) to regulated mechanical energy 18. In one embodiment, mechanical energy transmission system 15 is configured to convert a portion of the mechanical energy in a wave into mechanical energy of an internal energy storage mass that moves relative to the body of the marine device. For example, the mechanical energy transmission system 15 may transmit the wave power into movement of a mass slideably coupled to a linear slide and free to move along the single degree of freedom slide in response to the wave power. Energy in the wave then goes into moving both the marine device and energy storage mass, while the latter is used as input into generator 20. In another embodiment, the mechanical energy transmission system 15 transmits wave power into movement of a two portions of the marine device relative to each other. The two portions may include a frame in the marine device that is fixed relative to another portion that moves in response to the wave energy. This relative motion then serves as the controlled input into a generator.

Mechanical energy transmission system 15 permits marine device 10 to operate in a range of marine settings with widely varying wave characteristics. Suitable marine environments include open sea, bays, breakwater applications near a retaining wall, lakes, rivers and deltas, for example. Marine device 10 is well suited for use in bays where wave heights commonly vary from about 0.5 meters to about 1 meter, wave period varies from about 1 to about 4 seconds, and sea depth may vary from about 2 meters to about 40 meters. Other wave properties and marine conditions are suitable for use herein and the present invention is not limited to any particular marine environment or wave properties.

Electroactive polymer generator 20 converts the harnessed and regulated mechanical energy into electrical energy 22. Electroactive polymer transducers include large strain capabilities that can be well matched to ocean wave motion, allowing robust energy conversion with few moving parts. Electroactive polymer transducers are well suited for low frequency or variable speed mechanical input. Linear, as opposed to rotary motion, also favors electroactive polymer transducers. Electroactive polymer transducers are thus very useful when the mechanical input is intrinsically low frequency and/or variable speed, as in many marine environments.

Mechanical Energy Conversion System

This section describes suitable mechanical energy transmission systems that translate (kinetic and/or potential) mechanical energy in a wave into mechanical energy whose displacement and energy is limited to a known path or range of movements, which is then available for electrical energy generation by one or more electroactive polymers. The mechanical energy transmission systems permit the marine device to repeatedly harvest mechanical energy in the waves, despite the inconsistency and unpredictability in wave motion and input energy. In one embodiment, the mechanical energy transmission systems convert mechanical energy outside the marine device in the environment into regulated mechanical energy that is configured for input to an electroactive polymer generator.

Figure 3:
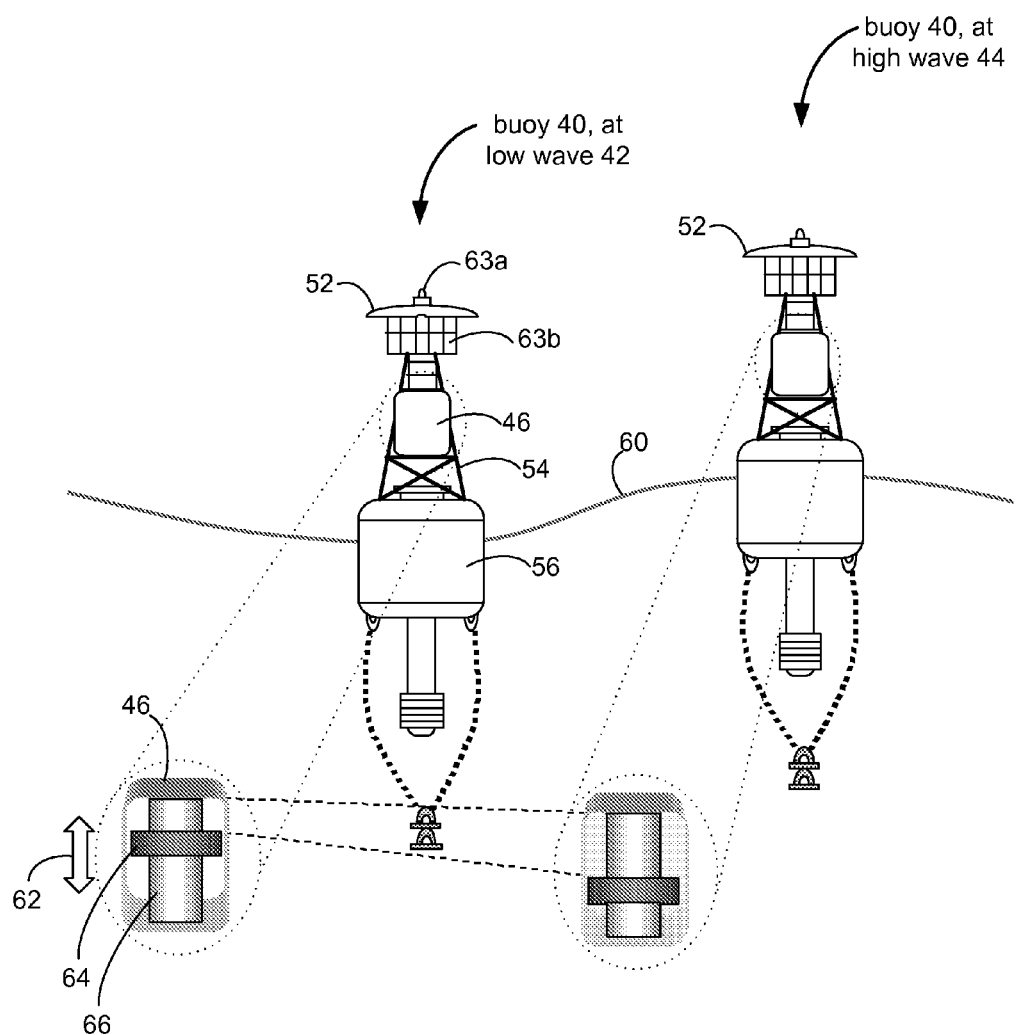
FIG. 3 shows a buoy, at two instances of wave height, in accordance with one embodiment of the present invention.

In one embodiment, marine device 10 is a buoy. FIG. 3 shows a buoy 40 in accordance with a specific embodiment of the present invention. Buoy 40 may be remotely implemented for navigation purposes and includes one or more lights 63 powered by a generation system.

FIG. 3 shows buoy 40 at two instances of wave height: a first wave height 42 and a second wave height 44. First wave height 42 corresponds to a low height for water surface level 60, such as a trough of the wave, while second wave height 42 corresponds to a high wave height for water surface level 60, such as the wave peak. Buoy 40 includes a body 52, light source 63, and a self-contained generation system 46.

Body 52 includes: a tower 54 that rests above water surface 60, and a base 56 that at least partially rests below water surface 60. Light source 63 is attached near the top of tower 54. Buoy 40 may also include a floatation collar (or other floatation devices) to assist buoyancy and keep light source 63 or another portion of body 52 above water surface 60. Base 56 includes an internal cavity (not shown in FIG. 3) defined by outer walls.

Self-contained generation system 46 includes a mechanical energy transmission system 15 and a generator. In a specific embodiment, self-contained generation system 46 is adapted for placement on an existing or slightly modified navigational buoy 40. In this instance, self-contained generation system 46 mechanically attaches to body 52 of buoy 40, such as to tower 54 or base 56, and is electrically coupled to the electrical system on buoy 40 for supplying power to operate light source 63. In another embodiment, self-contained generation system 46 is disposed in an internal cavity of base 56. As shown in FIG. 3, self-contained unit 46 is mounted on the buoy superstructure of tower 54, and can be mounted on buoy 40 long after the buoy has been manufactured or deployed. Thus, self-contained unit 46 is a separate structure that minimizes the changes needed to existing buoy designs. This embodiment permits adaptation of existing buoys to include local power generation without requiring design and purchase of new buoys. Self-contained generation system 46 then allows buoy 40 operation for long periods of time without the need for battery replacement.

FIG. 3 also shows a blow up and cross-sectional view of a particular embodiment of self-contained generation system 46, which includes mechanical energy transmission system 15 and a generator. Mechanical energy transmission system 15 converts mechanical energy in the water (and movement of buoy 40 on surface level 60) to kinetic energy of energy storage energy storage mass 64 along direction 62. In general, a mechanical energy transmission system 15 of the present invention may include any mechanical system that harnesses mechanical energy in a wave for use in electrical energy harvesting or for coupling directly or indirectly to an electroactive polymer. Typically this includes transmitting at least a portion of the wave motion, energy and/or power in a wave to motion, energy and/or power of a mass along one or more predetermined degrees of freedom (e.g., linear, rotary, combinations thereof, etc.). This transmission reduces unpredictability of the input wave energy and internally regulates the mechanical energy into known directions of displacement of the mass, which facilitates electrical energy conversion by the generator. The present invention contemplates numerous designs and mechanical systems that are suitable for this purpose. Several exemplary designs are described herein; in general, however, the present invention is not limited to these designs. In a specific embodiment, mechanical energy transmission system 15 includes a dynamic vibration absorber, which is described in more detail with respect to FIG. 4.

For buoy 40, the mechanical energy conversion system 15 in self-contained unit 46 includes an energy storage mass 64 that is configured to translate linearly along a cylindrical bore or axis 66, as shown by arrow 62. Mechanical energy conversion system 15 uses movement of energy storage mass 64 along axis 66 to generate energy internal to buoy 40 and along axis 66.

In one embodiment, energy storage mass 64 is a proof-mass, or a large weight, configured to generate enough force for electrical energy generation in response to waves of low frequency. The weight of mass 64, and its distance of travel along axis 66, is a matter of design choice and may vary with the application. Factors that may affect weight of energy storage mass 64 and its travel distance include: the amount expected wave energy (wave amplitude and frequency), the amount of energy needed by the marine device, size of buoy 40, the electrical energy generation system used and its components and configuration, the effective stiffness and damping characteristics of the energy transducer (electrical energy generator) that converts the linear motion of the proof-mass to electrical energy, etc. In one embodiment, energy storage mass 64 includes a mass between about 5 kg and about 300 kg. A travel distance along axis 66 of between about 0.2 meters and about 4 meters is suitable in many applications. Other mass sizes and travel distances are also suitable. In a specific embodiment, buoy 40 includes a mass greater than 100 kg or travel greater than 1 meter to produce 25 W of power at typical wave frequencies in the ocean or a bay that receives ocean waters. Either the mass size or travel distance may be limited to improve stability of the buoy, depending on its dimensions and size.

As will be described in further detail below, one or more electroactive polymer devices may be directly or indirectly attached to energy storage mass 64 and stretched and contracted as energy storage mass 64 moves along axis 66.

Light sources 64 include a top light source 64a and a central light source 64b. Either light source 64 may include a halogen lamps, light emitting diode, a prism for collecting and directing light to improve or focus light output, or any other conventional light source and/or light emitter.

In one embodiment, a marine device uses a dynamic vibration absorber (or 'dynamic absorber') to improve energy harvesting. Dynamic vibration absorbers may be damped or undamped. First, FIG. 4A illustrates a mechanical energy conversion system 15 configured to operate as an undamped dynamic vibration absorber 80 in accordance with one embodiment of the present invention.

As shown, dynamic absorber 80 includes a main mass 82, an absorber mass 64, a main stiffness k1, and an absorber stiffness k2. For a marine device, main mass 82 represents mass of the marine device (such as the body or hull in a buoy or breakwater generator), absorber mass 64 represents the energy storage mass 64 in the mechanical energy conversion system 15, k1 represents the stiffness of the marine device (such as stiffness of the body or hull in a buoy or breakwater generator), and k1 represents the stiffness of the mechanical energy conversion system 15 (or stiffness along axis 66 for FIG. 3).

Figure 4A:
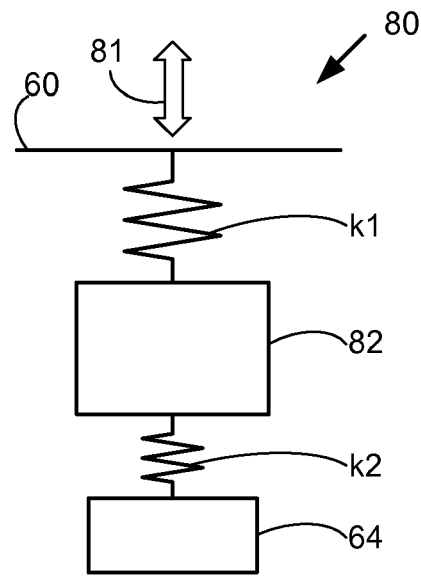
FIGS. 4A and 4B illustrates a mechanical energy conversion system that includes a dynamic absorber in accordance with one embodiment of the present invention.

Looking at FIG. 4A first without the absorber mass 64 attached, a periodic force 81, such as relative motion between the marine device and water resultant from a wave, acts on an undamped main mass-spring system 80. When the forcing frequency substantially equals the natural frequency of the main mass 82 and k1, the response and displacement of mass 82 becomes theoretically infinite. This represents resonance for main mass 82.

When an absorbing mass-spring system, or 'absorber', that includes mass 64 and k2, is attached to main mass 82 and the resonance of the absorber is tuned to substantially match that of the main mass, motion of main mass 82 is theoretically reduced to zero at its resonance frequency. Thus, the energy of main mass 82 is apparently "absorbed" by the tuned dynamic absorber. In theory, for this undamped system, motion of the absorber mass 64 is finite at this resonance frequency, even though there is no damping in either oscillator. This is theoretically because the system has changed from a one degree of freedom system to a two degree of freedom system and now has two resonance frequencies, neither of which equals the original resonance frequency of main mass 82 (and also absorber 64).

In one embodiment, mechanical energy conversion system 15 includes a dynamic absorber (e.g., mass 64 in FIG. 3 and its associated stiffness) that is tuned to resonate at a natural frequency of a marine device (the frequency at which the device would move with respect to the water). In a specific embodiment, this resonance frequency matching provides a resonant frequency for mechanical energy conversion system 15 that is within about 0.2 hertz of a resonant frequency for the marine device 10. In a specific embodiment, this resonance frequency matching provides a resonant frequency for mechanical energy conversion system 15 that is within about 0.2 Hertz of a resonant frequency for the marine device 10. This resonance matching increases the motion and harvested energy for electrical power generation provided by the mechanical energy conversion system 15. In addition, since the dynamic absorber also reduces motion and movement of the marine device, the mechanical energy conversion system also stabilizes the marine device 10. The stabilization function is useful for a navigation buoy that requires that its light location not move too much.

In a specific embodiment, suitable for instances where the wave period varies, marine devices of the present invention actively tune the absorber resonant frequency. This allows the mechanical energy conversion system 15 to operate at, and adapt to, multiple resonant frequencies and conditions. In one embodiment, the electrical energy generation system includes an electroactive polymer whose stiffness is adaptable and controlled to tune the dynamic absorber. Electroactive polymers are described below. In addition, further description of controlling stiffness of an electroactive polymer is provided in commonly owned U.S. Pat. No. 6,882,086, which is incorporated by reference in its entirety.

Figure 4B:
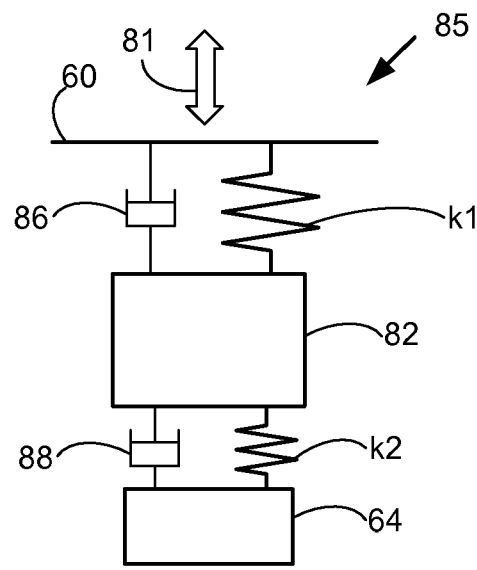

Referring now to FIG. 4B, realistically, marine device 10 includes some damping 86. Damping 86 may include interaction of the marine device 10 with the surrounding water, which provides parasitic energy losses. FIG. 4B shows mechanical energy conversion system 15 configured to operate as a damped dynamic absorber 85 in accordance with one embodiment of the present invention. In this case, the system 85 includes an effective damping 88 on the absorber mass 64. Damping 88 includes loses that result from electrical energy generation (in other words the energy that is converted from mechanical to electrical is effectively a damping) and other mechanical energy losses in marine device 10.

Damping will create new resonance frequencies in the system. Also, a finite amount of damping for both masses 82 and 64 will reduce the motion of either mass 82 and 64 at either of the new resonance frequencies. Often, if damping is present in either mass-spring element, the response of main mass 82 may no longer be theoretically zero at the target frequency.

Referring back to FIG. 3, when mechanical energy conversion system 15 includes a damped dynamic vibration absorber 85 that is tuned to the natural frequency of the marine device 10, then mechanical energy conversion system 15 decreases motion of buoy 40 and/or the anchoring structure in two manners: a) parasitic losses via (intentional) electrical energy generation, and b) (as mentioned above) conversion of motion of the buoy to the absorber mass 64 via the tuned natural frequencies. In this manner, mechanical energy conversion system 15 increases stability of buoy 40. Another way to view buoy 40 with a dynamic absorber is that some of the wave energy that normally moves the buoy goes instead into moving mass 82 and generating electrical energy.

The previous discussion was supported by theory based on linear lumped parameter models of the buoy and power generation devices. We do not wish to be bound by theory and further note that the system can operate effectively even in the presence of nonlinearites due to varying effective masses (the effective buoy mass includes entrained water, for example), nonlinear and time varying damping (due to the electrical power generation or variations in the parasitic losses) and distributed (as opposed to lumped) masses of the buoy, proof mass and electrical generator, for example. We also note that we have so far described a system that operates along a single axis of motion. We can design systems that operate with more than one direction of motion, such as might arise from both the up and down heaving and the rotary rocking of the buoy.

Other mechanical energy conversion systems 15 and marine device 10 designs are suitable for use herein. For example, mechanical energy conversion system 15 may be integrated into the structure of buoy 40 below the waterline in base 56, structurally integrated into the bottom extending stem of base 56, or other locations on a buoy above the waterline, below the waterline, and combinations thereof.

Figure 5A:
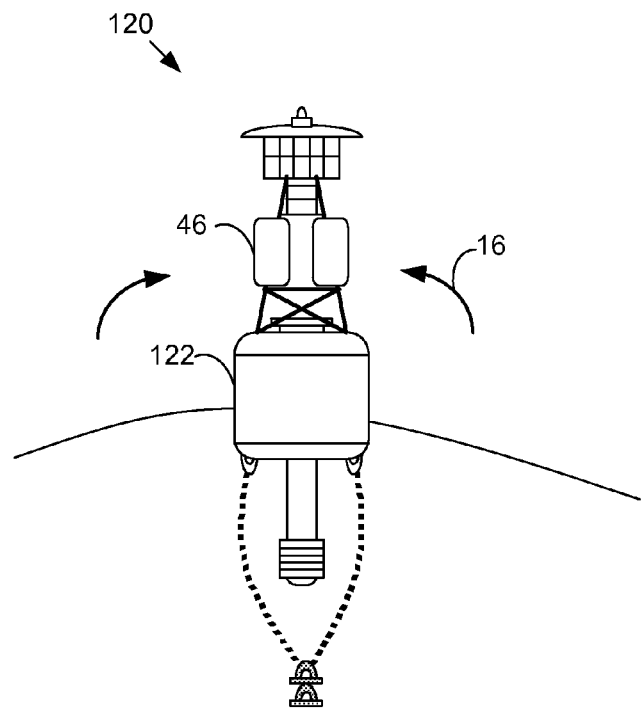
FIG. 5-9 show marine devices in accordance with various embodiments of the present invention.

FIG. 5A shows a buoy 120 in accordance with another embodiment of the present invention. Buoy 120 includes multiple mechanical energy conversion systems located around an upper periphery of the buoy body 122. Each of the mechanical energy conversion systems is included in a self-contained unit 46, situated away from the vertical center of mass for buoy 120. In FIG. 5A, buoy 120 includes four self-contained units 46 aligned vertically. More or less self-contained units 46 may also be used. In addition, the self-contained units 46 and their mechanical energy conversion systems 15 may be disposed in other locations about the buoy superstructure, which will affect the dynamic performance of the buoy in response to rocking and other motions.

This configuration, as opposed to a single self-contained unit 46 placed along the vertical center of mass of a buoy as shown in FIG. 3, allows for the capture of not only the up and down heaving of buoy 120 in the water, but also any angular rocking 16 of buoy 120. In pure vertical motion, the masses 64 in each self-contained unit 46 move in phase with one another. In rocking, they move out of phase. Also, by using more than one generator or allowing the generator to respond to rocking motion in addition to vertical motion, marine device 120 increases the overall power output.

Figure 5B:
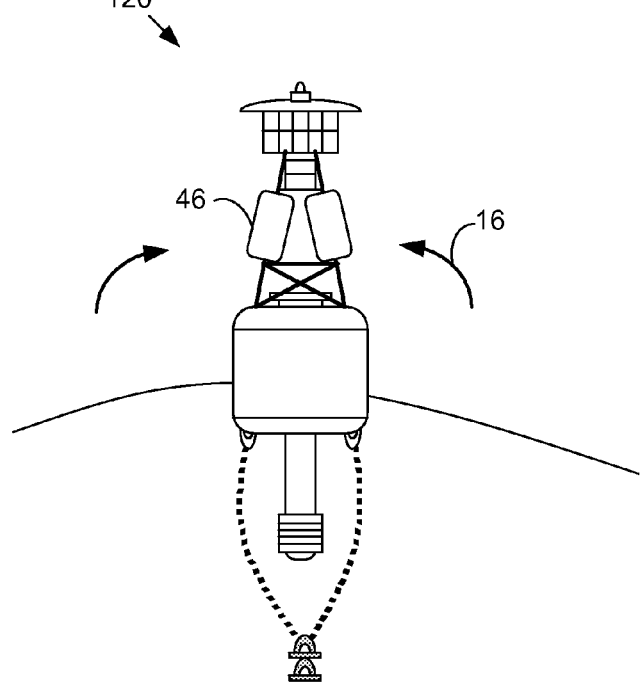

FIG. 5B shows a buoy 120 that includes four self-contained units 46, each aligned at an angle relative to a vertical axis of the buoy. This arrangement helps each self-contained unit 46 capture and translate horizontal motion more effectively. Cumulatively, multiple self-contained units 46, each aligned at an angle, permits buoy 120 to capture rocking and lateral motion in any horizontal direction. Angling the self-contained units 46 also reduces impact on the buoy profile while maintaining multi-degree of freedom energy harvesting. Additional horizontally-aligned self-contained units 46 may also be added to harvest surge motions more effectively.

When dynamic mass absorbers are used in each self-contained unit 46, this configuration also serves to stabilize buoy 120 in both modes of motion. In addition, using multiple single self-contained units 46 removes the reliance on a single unit and permits one to fail but maintain electrical energy generation.

Other mechanical energy transmission systems may be used. In another embodiment, mechanical energy transmission system 15 includes a linear translation mechanism that includes a first portion such as a rod or plunger that linearly translates along or in a second portion such as a cylinder. The two portions may be coupled to different parts of the marine device to harness wave energy. Typically, the different parts have relative motion caused by the wave energy and the mechanical energy transmission system 15 limits and harness that relative along the linear degree of freedom. An electroactive polymer then couples to the two portions of the mechanical energy transmission system 15 and uses the relative motion of the two portions as input for electrical energy conversion.

Figure 6:
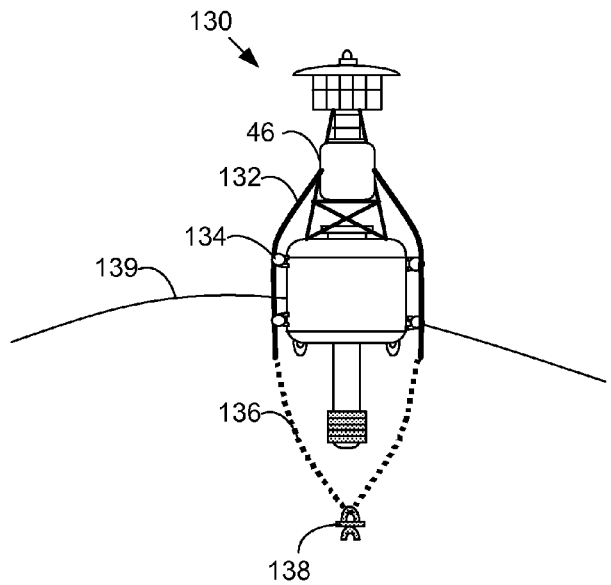

FIG. 6 shows a buoy 130 in accordance with another specific embodiment of the present invention.

Buoy 130 includes cables 132 that attach to the energy storage mass 64 in self-contained unit 46. Cables 132 may include a suitably stiff material, such as stainless steel, a chain or an abrasion resistant rope. As shown, cables 132 also extend to the mooring cables 136, which mechanically ground the buoy 130 and prevent it from floating away. Pulleys 134 are situated on the sides of buoy 130 to localize cable movement near the pulleys and reduce rotational forces on the buoy body.

When one or more of cables 132 is pulled taut by movement of buoy 130 relative to base 138 (typically as surface level 139 rises or at the wave high points and peaks of water surface 139), at least one of the cables 132 pulls down on mass 64. Up and down heaving of buoy 120 and/or the angular side-to-side rocking 16 of buoy 120 will then repeatedly cause one or more of cables 132 to displace mass 64 on its linear axis 66. The movement of energy storage mass 64 may then be converted to electrical energy. Since the cables now provide a propulsive force to storage mass 64, the mass can be reduced in size. In some cases, element 64 may be as simple as an attachment point that couples motion of a cable 132 to motion of an electrical generator element.

Figure 7:
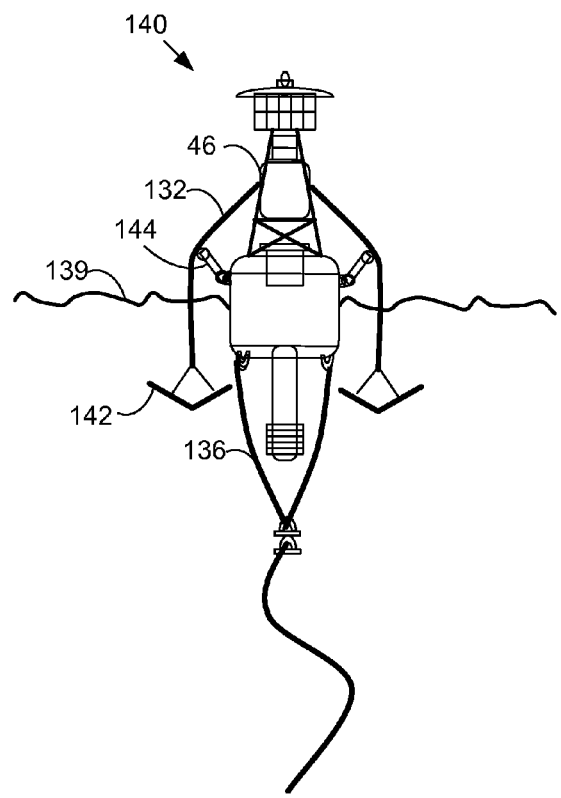

FIG. 7 shows a buoy 140 in accordance with another specific embodiment of the present invention. In this case, mechanical energy transmission system 15 includes cables 132 that indirectly attach the mass 64 (which again may be simply an attachment point) in system 15 to one or more water brakes 142. Pulleys 144 include stiff members that keep cables 132 distant from the body of buoy 140. Each water brake 142 includes a set of flat plates and a hinge that, together, act to resist upward movement but permit downward movement of the plates (with less water resistance since the hinge folds upwards and reduces surface area of the plates while moving downward). Water brakes 142 suitable for use herein are commercially available from Magma Products of Lakewood, Calif. Other devices that use a deformable cup shape, or a rigid cup in place of a hinged-mechanism are also suitable for use as a water brake and are commercially available.

Movement of buoy 140 in the water as surface level 139 changes causes relative motion between water brakes 142 and mass 64, which attaches to the cables, and production of electrical energy via the moving mass 64. In one embodiment, from 1 to about 6 water brakes 142 is suitable for use with buoy 140; each water brake 142 may include from 1 to about 4 cables. Another number of plates in water brakes 142 and cables 132 for each plate are also suitable for use.

Figure 8:
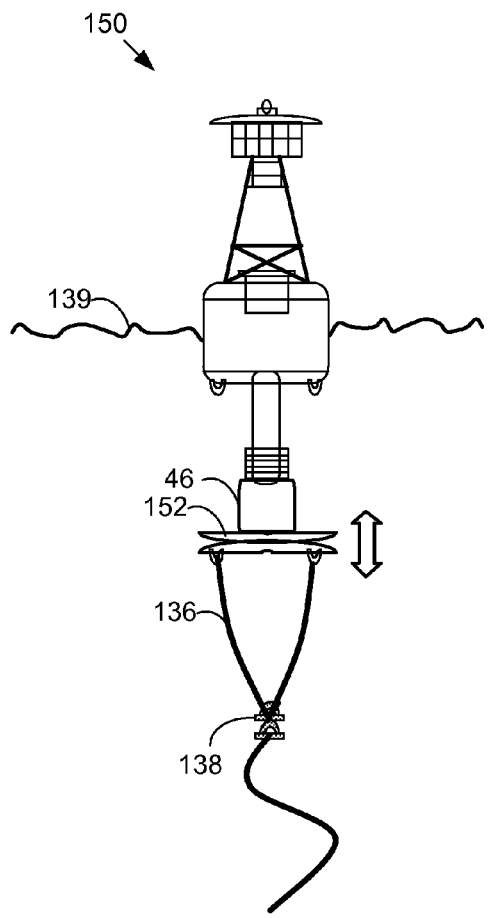

FIG. 8 shows a buoy 150 in accordance with another specific embodiment of the present invention. Buoy 150 includes a mechanical energy transmission mechanism 155 that is submerged below water line 139, and attaches directly to the bottom of buoy 150 and a water brake 152. In this case, water brake 152 includes a rigid plate (with no joints) that resists both upwards and downwards motion of buoy 150. Mooring cables 136 attach to the bottom of water brake 152. Mechanism 155 is configured in this case such that movement of buoy 150 relative to base 138 is slowed by brake 152 and causes a net displacement in a component (e.g., a plunger) in mechanical energy transmission mechanism 155 that also couples to the body and to an electroactive polymer 20.

Figure 9:
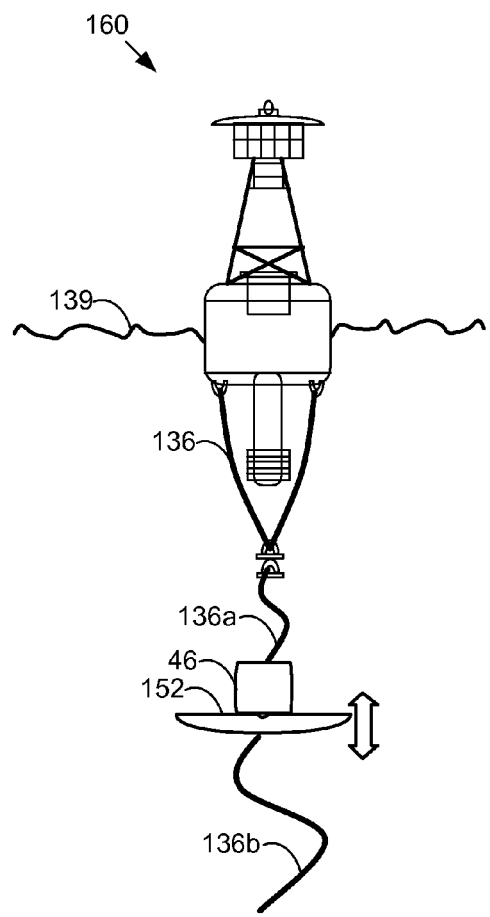

FIG. 9 shows a buoy 160 in accordance with another specific embodiment of the present invention. Buoy 160 includes a mechanical energy transmission mechanism 165 that is also submerged below water line 139, but attaches to the mooring cable system 136. Water brake 152 includes one or more rigid plates that resist both upwards and downwards motion of buoy 150. In this instance, a mooring cable 136*a* attaches to: a) buoy 160, and b) the top of mechanism 165, which attaches to water brake 152, which attaches to a second mooring cable 136*b*. Relative motion of buoy on water level 139 pulls on cable 136*a*, which moves mechanical coupling in mechanism 165 that attaches to an inlet of an electrical generator.

Electroactive Polymer Generation

Marine device 10 includes an electroactive polymer transducer that converts mechanical to electrical energy. Electroactive polymer transducers are particularly well suited to receive both linear and/or rotary input, such as mechanical energy from a mass moving along a linear axis.

Figure 10:
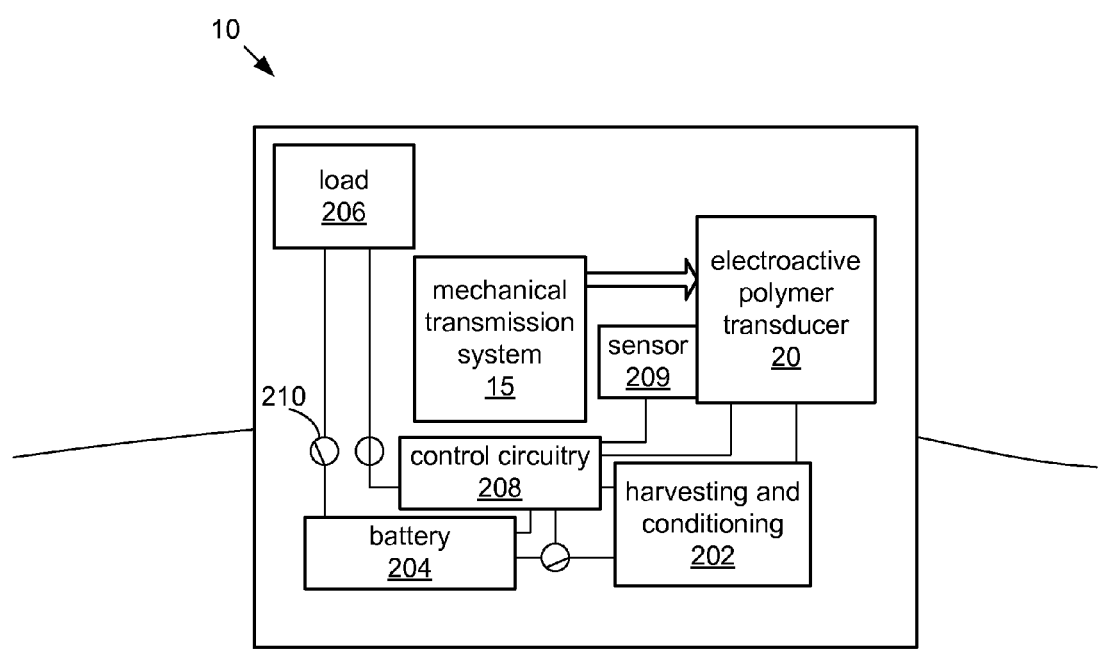
FIG. 10 shows a schematic illustration of a marine device in accordance with another embodiment of the present invention.

FIG. 10 shows a schematic illustration of a marine device 10 in accordance with another embodiment of the present invention. Marine device 10 includes electroactive polymer transducer 20, harvesting and conditioning circuitry 202, battery 204, load 206 and control circuitry 208.

Electroactive polymer transducer 20 is configured for use as a generator. While electroactive polymers may convert between electrical energy and mechanical energy in a bi-directional manner, the present invention will focus on converting mechanical energy to electrical energy. Although shown as a single unit, electroactive polymer transducer 20 may include multiple electroactive polymer transducers that are configured to convert mechanical energy to electrical energy.

Electroactive polymer transducer 20 may be configured in a variety of devices that each includes one or more electroactive polymers. Several suitable electroactive polymer transducer designs are described in further detail below.

Dielectric elastomers are one suitable type of electroactive polymer and include a relatively soft rubbery polymer disposed between two compliant electrodes. Dielectric elastomer transducers may operate in actuator mode, generator mode, and/or sensor mode, depending on configuration and their driving circuitry. Stiffness for a dielectric elastomer transducer may also be controlled. Other suitable electroactive polymer materials are also described below.

The generation and utilization of electrical energy from the electroactive polymer generator devices may employ conditioning electronics of some type. For instance, at the very least, a minimum amount of circuitry is needed to remove electrical energy from the electroactive polymer transducer. Further, as another example, circuitry of varying degrees of complexity may be used to increase the efficiency or quantity of electrical generation in a particular type of generator device or to convert an output voltage to a more useful value for the application generator device.

Harvesting and conditioning circuitry 202 includes any circuitry configured to perform one or more of the following tasks: energy harvesting, voltage step-up or step-down, conversion between AC and DC power, smoothing voltage, priming the system with a voltage for startup, conditioning power output for an electrical load or the power grid, emergency shut-down, storing energy from the generator to provide output power during periods of low wave activity, communicating fault conditions (e.g. if the generator is not working properly), and adapting the system to compensate for unexpected or expected generator failure modes (e.g. loss of one of several electroactive polymer devices either unexpectedly or expected as a result of graceful lifetime decay. In some cases, harvesting and conditioning circuitry 202 includes circuits and software that allows components on marine device 10 to adapt to varying wave conditions, such as tuning stiffness in a mechanical energy transmission system 15 to obtain a dynamic absorber. Circuitry 202 may also be configured to efficiently harvest the energy from generator 20 despite unknown input frequencies and amplitudes, and that depend on the mechanical transmission system 15 and generator 20 selected. For example, an electroactive polymer may introduce nonlinear varying electrical properties that are managed by conditioning circuitry 202. Harvesting and conditioning circuitry 202 may also provide a small voltage for initial startup, if needed.

In one embodiment, harvesting and conditioning circuitry 202 removes energy from electroactive polymer transducer 20 at frequency higher than the input mechanical frequency. This permits harvesting and conditioning circuitry 202 to withdraw numerous small energy packets as opposed to a few large ones for a given stroke of electroactive polymer transducer 20. It also avoids saturation of any inductors in the circuit, which may occur at low withdrawal frequencies. In a specific embodiment, the conditioning circuitry 202 removes energy from electroactive polymer transducer 20 at a frequency three orders of magnitude greater than the input mechanical frequency. In another specific embodiment, the conditioning circuitry 202 removes energy from electroactive polymer transducer 20 at a frequency of greater than 1 kHz.

Harvesting and conditioning circuitry 202 may also employ an LRC circuit configured for use in a marine environment. In this case, the electroactive polymer transducer 20 contributes capacitance in the LRC circuit. The electroactive polymer LRC circuit may be tuned or optimized to the marine application. For example, a time constant of the electroactive polymer LRC circuit may be tuned to an expected input wave frequency in the marine environment. Alternately, the inductance and LRC characteristics can be chosen to match the EPAM capacitance and minimize losses from resistance in the electrodes and inductor. Further description of electroactive polymer LRC circuits is provided in commonly owned and co-pending patent application No. 60/894,014 naming Ron Pelrine et al. as inventors and entitled "LRC Circuit for Energy Harvesting Using Electroactive Polymers" filed on the same day as the present invention; this patent application is incorporated by reference in its entirety for all purposes.

Sensor 209 detects the position or deflection state of electroactive polymer transducer 20. In one embodiment, sensor 209 includes one or more switches that are each configured to indicate a stroke position of the electroactive polymer transducer. For example, one of the switches 290 may be configured to indicate an extreme stroke position of the electroactive polymer transducer 20. In another embodiment, one or more active areas on the electroactive polymer transducer are configured for sensing and position detection of the electroactive polymer.

Battery 204 stores electrical energy for later use. Rechargeable batteries are thus well suited for use, such as any conventional and commercially available battery.

Load 206 generally includes any device or system that consumes electrical energy. Load 206 will vary with the marine device. For a navigation buoy, load 206 typically includes one or more lights and/or communication resources. Other types of buoys may require energy to power sensors, computers and radio transmissions, for example. Marine generators deployed for electrical energy harvesting and provision onto a grid may include energy monitoring, device health monitoring, and/or communication resources.

Marine device 10 may also include control circuitry 208, which includes any combination of hardware and/or software for one or more controlling components on marine device 10. For example, control circuitry 208 may manage the power output between flashing lights 206 and recharging batteries 204. Control circuitry 208 also regulates switches 210, which control the movement of electrical energy in marine device 200. In one embodiment, control circuitry 208 includes a processor and memory, where the memory includes software with instructions that enable processor to execute methods of electrical energy generation described herein.

An electroactive polymer transducer typically includes an electroactive polymer with compliant electrodes coupled thereto. In generation mode, an electroactive polymer transducer includes a polymer arranged in a manner that causes a change in electric field in response to deflection of a portion of the polymer. The change in electric field, along with changes in the polymer dimension in the direction of the field, produces a change in voltage, and hence a change in electrical energy.

Figure 11A:
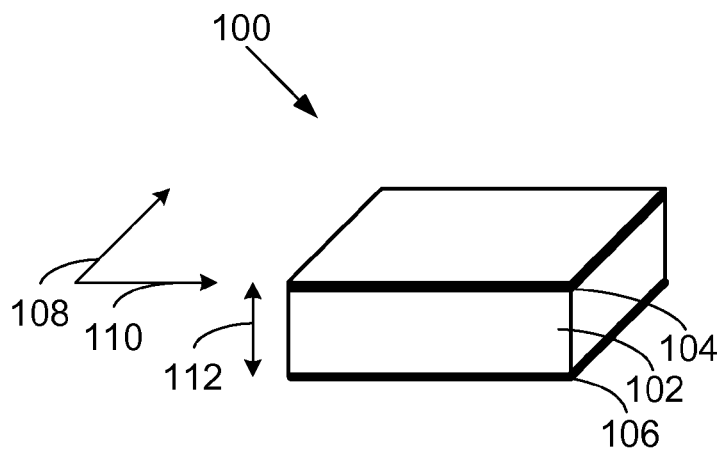
FIGS. 11A and 11B illustrate a top perspective view of a transducer before and after deflection in accordance with one embodiment of the present invention.

FIG. 11A illustrates a top perspective view of an electroactive polymer transducer portion 100 in accordance with one embodiment of the present invention. The transducer portion 100 comprises an electroactive polymer 102 for converting between electrical energy and mechanical energy. In one embodiment, an electroactive polymer refers to a polymer that acts as an insulating dielectric between two electrodes. Top and bottom electrodes 104 and 106 are attached to the electroactive polymer 102 on its top and bottom surfaces, respectively, to provide a voltage difference across a portion of the polymer 102. For polymer 102, mechanical deflection of the polymer and electric field in the polymer are related.

Figure 11B:
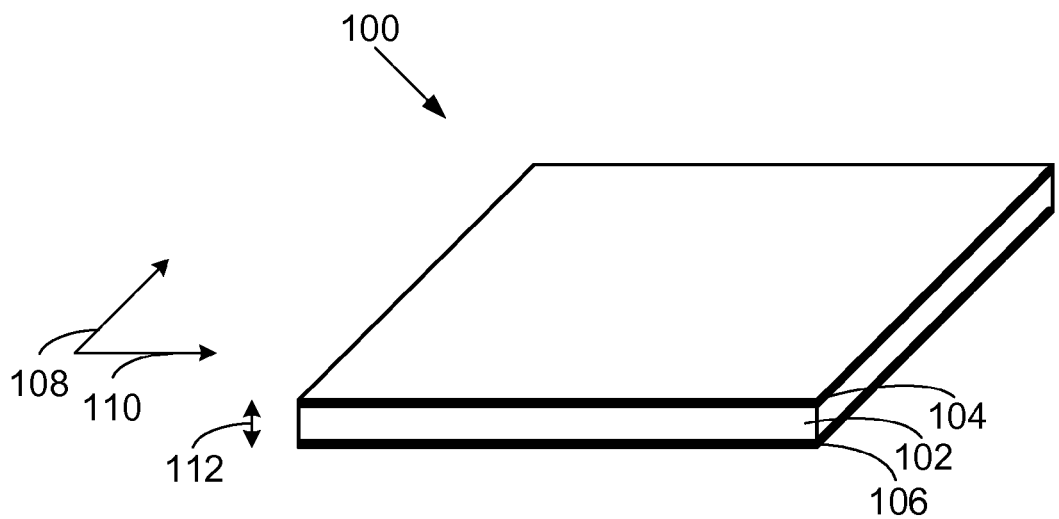

FIG. 11B illustrates a top perspective view of the transducer portion 100 including deflection. In general, deflection refers to any displacement, expansion, stretch, contraction, torsion, linear or area strain, or any other deformation of a portion of the polymer 102.

For actuation, a change in electric field corresponding to the voltage difference applied to or by the electrodes 104 and 106 produces mechanical pressure within polymer 102. In this case, the unlike electrical charges produced by electrodes 104 and 106 attract each other and provide a compressive force between electrodes 104 and 106 and an expansion force on polymer 102 in planar directions 108 and 110, causing polymer 102 to compress between electrodes 104 and 106 and stretch in the planar directions 108 and 110. Thus, application of an actuation voltage difference between electrodes 104 and 106 on the transducer portion 100 shown in FIG. 11A will cause transducer portion 100 to change to a thinner, larger area shape as shown in FIG. 11B. In this manner, the transducer portion 100 converts electrical energy to mechanical energy.

FIGS. 11A and 11B may be used to show one manner in which the transducer portion 100 converts mechanical to electrical energy. For example, if the transducer portion 100 is mechanically stretched by mechanical transmission system 15 to a thinner, larger area shape such as that shown in FIG. 11B, and a relatively small voltage difference (less than that necessary to actuate the film to the configuration in FIG. 11B) is applied between electrodes 104 and 106, transducer portion 100 will contract in area between the electrodes to a shape such as in FIG. 11A when the external forces are removed. Stretching the transducer refers to deflecting the transducer to result in a larger net area between the electrodes, e.g. in the plane defined by directions 108 and 110 between the electrodes. Once transducer portion 100 is stretched, the relatively small voltage difference is provided such that the resulting electrostatic forces are insufficient to balance the elastic restoring forces of the stretch. Transducer portion 100 therefore contracts, and it becomes thicker and has a smaller planar area in the plane defined by directions 108 and 110 (orthogonal to the thickness between electrodes). When polymer 102 becomes thicker, it separates electrodes 104 and 106 and their corresponding unlike charges, thus raising the electrical energy and voltage of the charge. Further, when electrodes 104 and 106 contract to a smaller area, like charges within each electrode compress, also raising the electrical energy and voltage of the charge. Thus, with different charges on electrodes 104 and 106, contraction from a shape such as that shown in FIG. 4B to one such as that shown in FIG. 4A raises the electrical energy of the charge. That is, mechanical deflection is being turned into electrical energy and the transducer portion 100 is acting as a generator. In addition to the elastic restoring forces, external forces from the mechanical transmission can also be used to assist the polymer in returning to its unstretched state.

In some cases, transducer portion 100 may be described electrically as a variable capacitor. The capacitance decreases for the shape change going from that shown in FIG. 11B to that shown in FIG. 11A. Typically, the voltage difference between electrodes 104 and 106 will be raised by contraction. This is normally the case, for example, if additional charge is not added or subtracted from electrodes 104 and 106 during the contraction process. The increase in electrical energy, U, may be illustrated by the formula U=0.5 Q2/C, where Q is the amount of positive charge on the positive electrode and C is the variable capacitance which relates to the intrinsic dielectric properties of polymer 102 and its geometry. If Q is fixed and C decreases, then the electrical energy U increases.

The increase in electrical energy and voltage can be recovered or used in a suitable device or harvesting circuitry 202 in electrical communication with electrodes 104 and 106. In addition, transducer portion 100 is mechanically coupled to mechanical transmission system that deflects the polymer and provides mechanical energy.

Transducer portion 100 will convert mechanical energy to electrical energy as it contracts. Harvesting circuitry 202 (FIG. 10) may remove some or all of the charge and energy when the transducer portion 100 is fully contracted in the plane defined by directions 108 and 110. Alternatively, some or all of the charge and energy can be removed during contraction. If the electric field pressure in the polymer increases and reaches balance with the mechanical elastic restoring forces and external load during contraction, the contraction will stop before full contraction, and no further elastic mechanical energy will be converted to electrical energy. Removing some of the charge and stored electrical energy reduces the electrical field pressure, thereby allowing contraction to continue. Thus, removing some of the charge may further convert mechanical energy to electrical energy. The exact electrical behavior of the transducer portion 100 when operating as a generator depends on any electrical and mechanical loading as well as the intrinsic properties of polymer 102 and electrodes 104 and 106.

In some cases, electrodes 104 and 106 cover a limited portion of polymer 102 relative to the total area of the polymer. As the term is used herein, an active area is defined as a portion of a transducer comprising polymer material 102 and at least two electrodes. When the active area is used to convert mechanical energy to electrical energy, the active area includes a portion of polymer 102 having sufficient deflection to enable a change in electrostatic energy.

Transducers and polymers of the present invention are not limited to any particular geometry or deflection. For example, the polymer and electrodes may be formed into any geometry or shape including tubes and rolls, stretched polymers attached between multiple rigid structures, stretched polymers attached across a frame of any geometry—including curved or complex geometries, across a frame having one or more joints, etc. Deflection of a transducer may include linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. In one embodiment, a flexible material that is stiffer in elongation than the polymer is attached to one side of a transducer induces bending when the polymer is actuated. In another embodiment, a transducer that deflects out of the plane is referred to as a diaphragm.

In one embodiment, polymer 12 is compliant and selected based on its elastance. A modulus of elasticity for polymer 12 less than about 100 MPa is suitable for many embodiments. In one specific embodiment, electroactive polymer 12 includes an elastic modulus less than 40 MPa. In another specific embodiment, electroactive polymer 12 is relatively compliant and includes an elastic modulus less than 10 MPa.

Suitable electroactive polymers include any substantially insulating polymer or rubber (or combination thereof) whose deformation results in a change in electric field. Preferably, the polymer's deformation is reversible over a wide range of strains. Many elastomeric polymers may serve this purpose. In some cases, polymer 102 includes a commercially available polymer. This may include, for example, any commercially available silicone elastomer, polyurethane, PVDF copolymer and adhesive elastomer. One suitable commercially available polymer is NuSil CF19-2186 as provided by NuSil Technology of Carpenteria, Calif. An example of a suitable silicone elastomer is Dow Coming HS3 as provided by Dow Corning of Wilmington, Del. One example of a suitable fluorosilicone is Dow Corning 730 as provided by Dow Corning of Wilmington, Del. Examples of suitable acrylics include any acrylic in the 4900 VHB acrylic series as provided by 3M Corp. of St. Paul, Minn.

Electroactive polymer 102 may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 200 micrometers.

Although the discussion so far has focused primarily on one type of electroactive polymer commonly referred to as dielectric elastomers, electroactive polymer transducers of the present invention may also incorporate other electroactive polymers. Other suitable classes of electroactive polymer suitable for use with some embodiments of the present invention include electrostrictive polymers, piezoelectric polymers such as PVDF, and conductive electroactive polymers. Electrostrictive polymers are conventionally described as polymers with an intrinsic strain response proportional to the square of the electric field. Conductive polymers are polymers that can conduct electricity. Conductive polymers include electronically conductive polymers as well as ionically conductive polymers. Ionic polymers are polymers that can conduct ions and are often wet to enhance ion mobility.

In one embodiment, electroactive polymer 102 is pre-strained. Pre-strain of a polymer may be described, in one or more directions, as the change in dimension in a direction after pre-straining relative to the dimension in that direction before pre-straining. The pre-strain may comprise elastic deformation of polymer 102 and be formed, for example, by stretching the polymer in tension and fixing one or more of the edges while stretched. In one embodiment, pre-strain improves the dielectric strength of the polymer. In another embodiment, the pre-strain is elastic. An elastically pre-strained polymer could, in principle, be unfixed and return to its original state. The pre-strain may be imposed at the boundaries using a rigid frame or may also be implemented locally for a portion of the polymer. In one embodiment, pre-strain is applied uniformly over a portion of polymer 102 to produce an isotropic pre-strained polymer. By way of example, an acrylic elastomeric polymer may be stretched by 200 to 400 percent in both planar directions. In another embodiment, pre-strain is applied unequally in different directions for a portion of polymer 102 to produce an anisotropic pre-strained polymer. Anisotropic pre-strain may improve the performance of a transducer to convert mechanical to electrical energy in a generator mode. In addition to increasing the dielectric breakdown strength of the polymer and allowing more charge to be placed on the polymer, high pre-strain may improve mechanical to electrical coupling in the low pre-strain direction. That is, more of the mechanical input into the low pre-strain direction can be converted to electrical output, thus raising the efficiency of the generator. Pre-strain suitable for use with the present invention is further described in commonly owned U.S. Pat. No. 7,034,432, which is incorporated by reference for all purposes.

Electrodes 104 and 106 are compliant and change shape with polymer 102. In one embodiment, one of the electrodes 104 and 106 is ground. Generally, electrodes suitable for use with the present invention may be of any shape and material provided that they are able to supply a suitable voltage to, or receive electrical energy from, an electroactive polymer. The voltage may be either constant or varying over time. In one embodiment, the electrodes adhere to a surface of the polymer. Electrodes adhering to the polymer are preferably compliant and conform to the changing shape of the polymer. Correspondingly, the present invention may include compliant electrodes that conform to the shape of an electroactive polymer to which they are attached. The electrodes may be only applied to a portion of an electroactive polymer and define an active area according to their geometry.

Suitable electrodes materials include conductive greases such as carbon greases or silver greases, colloidal suspensions, high aspect ratio conductive materials such as carbon fibrils and carbon nanotubes, and mixtures of ionically conductive materials. Other suitable materials include graphite, carbon black, colloidal suspensions, thin metals including silver and gold, silver filled and carbon filled gels and polymers, and ionically or electronically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease. Another suitable electrode includes electronic grade carbon blacks such as Cabot Vulcan XC72R mixed into a thick silicone oil binder. Various types of electrodes suitable for use with the present invention are described in commonly owned U.S. Pat. No. 7,034,432, which was previously incorporated by reference above.

In one embodiment, the electroactive polymer transducer includes multiple active areas. The multiple active areas may be arranged on a single polymer. The ability to arrange multiple active areas on a single polymer allows for numerous transducer configurations.

Figure 12:
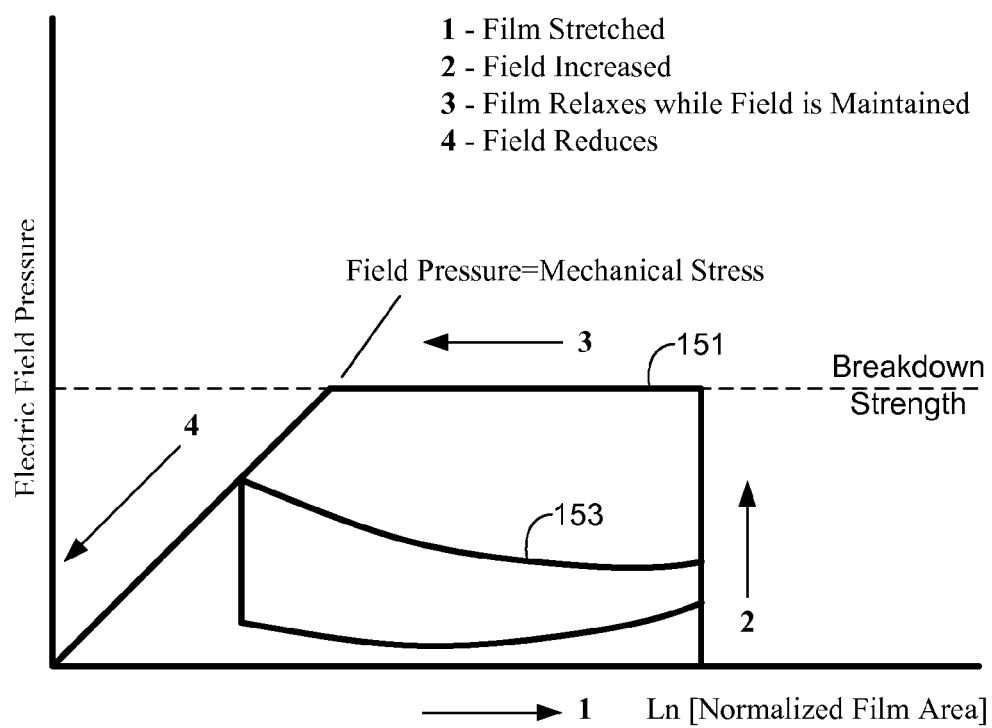
FIG. 12 shows illustrative cycles for harvesting energy from a generator employing an electroactive polymer transducer in accordance with one embodiment of the present invention.

FIG. 12 shows illustrative cycles 151 and 153 for harvesting energy with an electroactive polymer. In the present invention, mechanical energy from a wave, as translated by the mechanical energy transmission system 15, is used to deflect or stretch or otherwise deflect an electroactive polymer. Over time, the polymer may be stretched and relaxed over many cycles by numerous waves and water level changes. FIG. 12 shows a theoretical cycle 151 and a practical cycle 153 of an electroactive polymer stretching and relaxing to convert mechanical energy to electrical energy. Cycles 151 and 153 are for illustrative purposes only; many different types of cycles may be employed and the present invention is not limited to the cycles shown in FIG. 12.

In 1, the electroactive polymer is stretched with zero (cycle 151) or little (cycle 153) electric field pressure on the polymer. The mechanical energy transmission system 15 stretches the polymer. In 2, the electric field pressure on the polymer is increased to some maximum or increased value. Conditioning electronics necessary to perform this function are described with reference to FIG. 10. For the theoretical cycle 151, the maximum value of the electric field pressure is just below the breakdown strength of the polymer, allowing for changes in the environment, lifetime, and the polymer, which may change the breakdown strength of the polymer. In 3, the polymer relaxes while the electric field pressure is maintained at its maximum or elevated value. Again, movement of the mechanical energy transmission system 15 causes the polymer to relax. As the polymer relaxes, voltage of the charge on the polymer increases. The increase in charge's electrical energy, as indicated by its higher voltage, on the polymer is harvested to generated electrical energy. In 4, the polymer relaxes further or fully as the electric field pressure is reduced and the cycle may be repeated. For instance, the cycle may be initiated again as a mass in the mechanical energy transmission system 15 begins a new linear stroke (1,3), as perceived by a sensor configured to detect position or movement of the mass.

Practical considerations dictate that energy output in a realistic cycle 153 will be less than the theoretical maximums 151. For example, the extremes of theoretical cycle 151 may be avoided to increase lifetime of the polymer generator, or to permit simpler circuitry.

Electrical energy may be added to the polymer at certain times in a cycle and removed in other portions of the cycle. In general, electroactive polymer generators are designed such that the total electrical energy added to the polymer is less than the total electrical energy removed from the polymer during a cycle. Also, generator components such as the conditioning electronics are designed to minimize electrical losses such that a net amount of electrical energy output from the generator is positive.

Portions of an electroactive polymer device may also be configured to provide variable stiffness. As mentioned above, this may be used to tune a dynamic absorber to increase mechanical energy harvesting, reduce marine device 10 motion, and increase marine device 10 stability. Systems employing an electroactive polymer transducer offer several techniques for providing stiffness control. In one embodiment, open loop techniques are used to control stiffness of a device employing an electroactive polymer transducer, thereby providing simple designs that deliver a desired stiffness performance without sensor feedback. For example, control electronics in electrical communication with electrodes of the transducer may supply a substantially constant charge to the electrodes. Alternately, the control electronics may supply a substantially constant voltage to the electrodes. Closed-loop stiffness control may be used to adaptively tune a dynamic absorber—reactively and in real time—to the natural frequency in a marine device. Exemplary circuits for providing stiffness/damping control are provided in commonly owned U.S. Pat. No. 6,882,086.

For many electroactive polymer transducers, higher operating voltages increase the amount of energy that can be generated for a given amount of material. Voltages of 100 V to 5 kV, corresponding to electrical fields within the polymer of up to 100 MV/m or more, are typical. Electronic circuit designs have been developed for both stepping up low voltages to high voltages, and for stepping down high voltages to low voltages. Many basic circuit designs have been adapted from other applications, such as voltage conversion circuits for fluorescent lights, and are low cost and reliable.

Electroactive polymers can be implemented into a wide variety of transducers and devices. Exemplary devices include rolls, linear motion devices, and diaphragm devices. Many of these transducers, such as a roll, can package a large amount of electroactive polymer material into a compact shape. U.S. Pat. No. 6,781,284 describes several transducers and devices suitable for use herein.

Figure 13A:
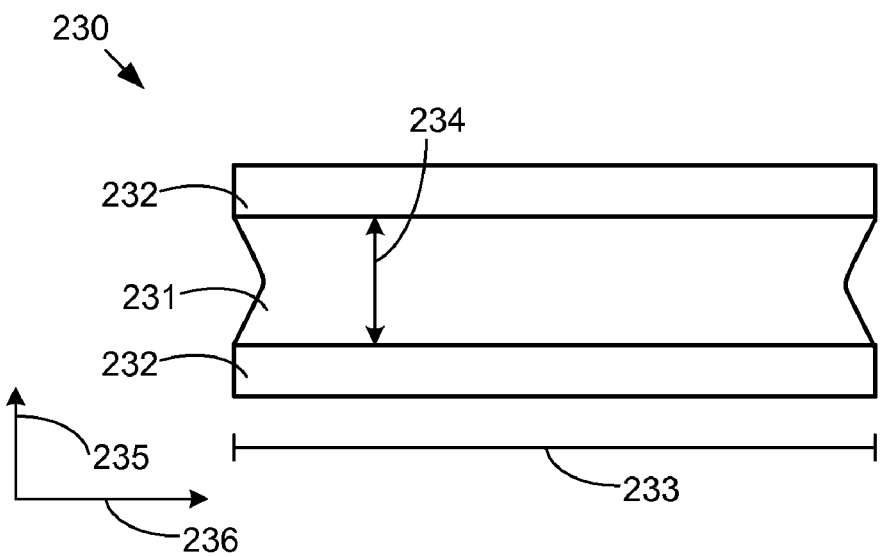
FIGS. 13A and 13B illustrate a linear motion device for converting between mechanical and electrical energy in accordance with a specific embodiment of the present invention.
Figure 13B:
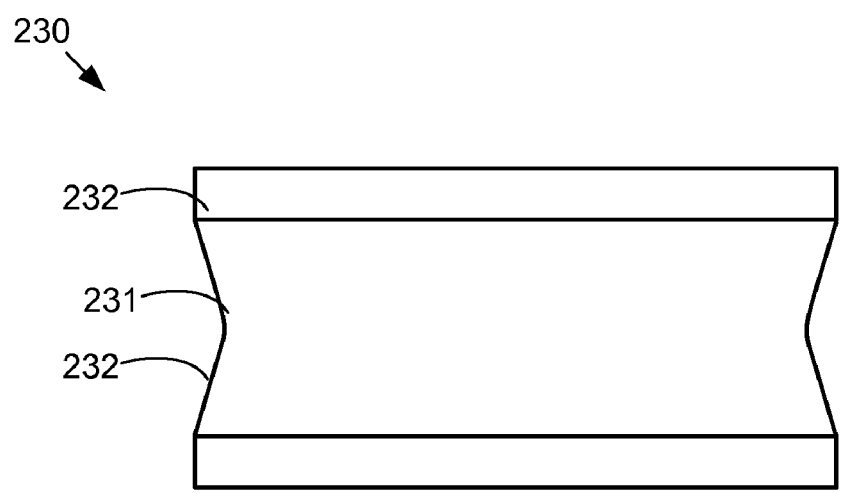

FIGS. 13A and 13B illustrate a linear motion device 230 for converting between mechanical and electrical energy in accordance with a specific embodiment of the present invention. Linear motion device 230 is a planar mechanism having mechanical translation in one direction, 235. The linear motion device 230 comprises an electroactive polymer 231 having a length 233 greater than its width 234. In a specific embodiment, polymer 231 includes a 2:1 length to width ratio.

Polymer 231 is attached on opposite sides to stiff members 232 of a frame along its length 233. Stiff members 232 have a greater stiffness than the polymer 231. The geometric edge constraint provided by stiff members 232 prevents displacement in a direction 236 along polymer length 233 and facilitates deflection in direction 235. In some dielectric elastomers, such as acrylics, it is desirable to prestrain the polymer material in order to get it to the desired thickness and stiffness. When linear motion device 230 is implemented with a polymer 231 having anisotropic pre-strain, such as a higher pre-strain in the direction 236 than in the direction 235, then polymer 231 is stiffer in the direction 236 than in direction 235 and large deflections in direction 235 are permissible. By way of example, such an arrangement may produce linear strains of at least about 200 percent for acrylics having an anisotropic pre-strain.

Linear motion device 230 is well suited to receive motion of energy storage mass 64 along a linear slide 66 in self-contained unit 46 of FIG. 3, for example. Charge is then added to and removed by control circuitry 208 or harvesting and conditioning circuitry 202 (FIG. 10) according to the position of mass 64 as it stretches and contracts polymer 231.

Figure 14A:
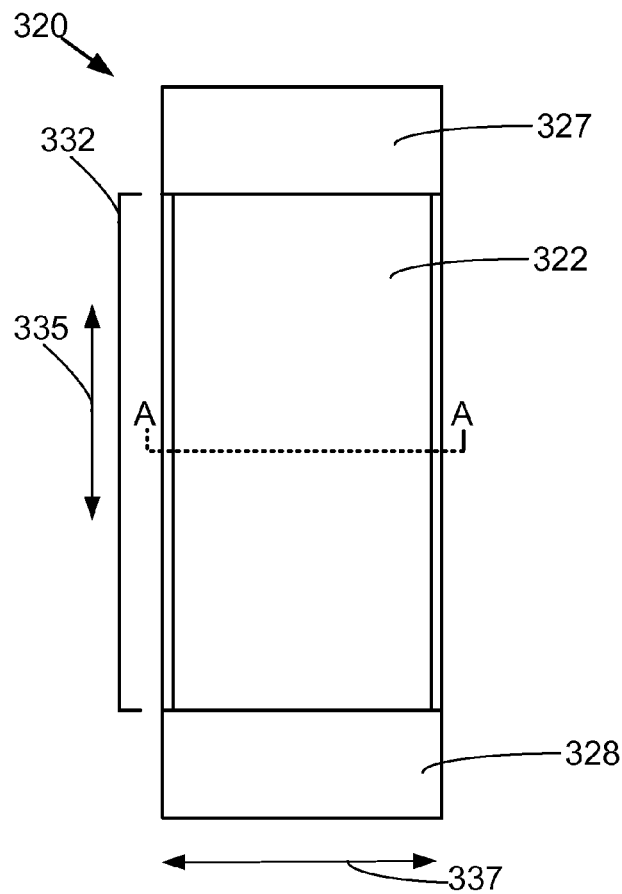
FIGS. 14A-14C show a rolled electroactive polymer device suitable for mechanical to electrical energy conversion in accordance with a specific embodiment of the present invention.
Figure 14B:
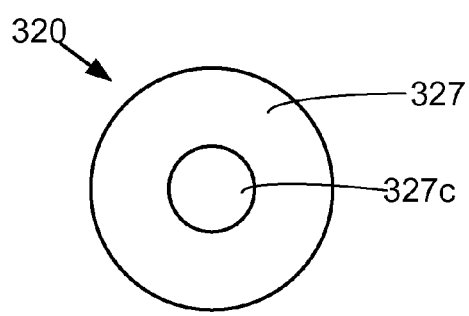
Figure 14C:
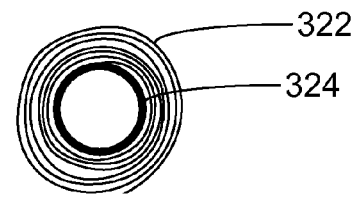

Electroactive polymers may also be rolled to increase the amount of polymer in a confined space. FIGS. 14A-14C show a rolled electroactive polymer device 320 suitable for mechanical to electrical energy conversion in accordance with a specific embodiment of the present invention. FIG. 14A illustrates a side view of device 320; FIG. 14B illustrates an axial view of device 320 from its top end; FIG. 14C illustrates an axial view of device 320 taken through cross section A-A. Device 320 comprises a rolled electroactive polymer 322, end pieces 327 and 328, and spring 324.

FIG. 14C shows the rolled layering of electroactive polymer 322. A rolled electroactive polymer may include an electroactive polymer with, or without electrodes, wrapped round and round onto itself (e.g., like a scrolled poster) or wrapped around another object (e.g., spring 324). For single electroactive polymer layer construction, a rolled electroactive polymer of the present invention may comprise between about 2 and about 200 layers. Polymer 322 and spring 324 are capable of axial deflection between their respective bottom top portions.

End pieces 327 and 328 are attached to opposite ends of rolled electroactive polymer 322 and spring 324. End piece 327 has an inner hole 327c that includes an internal thread capable of threaded interface and detachable mechanical attachment with a threaded member, such as a screw or threaded bolt.

As mentioned above, many electroactive polymers perform better when prestrained. Spring 324 of device 320 provides forces that result in both circumferential and axial prestrain for polymer 322. Spring 324 is a compression spring that provides an outward force in opposing axial directions (FIG. 14A) that axially stretches polymer 322 and strains polymer 322 in an axial direction. Thus, spring 324 holds polymer 322 in tension in axial direction 335.

Rolled electroactive polymer devices allow for compact electroactive polymer device designs. The rolled devices provide a potentially high electroactive polymer-to-structure weight ratio, and can be configured to actuate in many ways including linear axial extension/contraction, bending, and multi-degree of freedom actuators that combine both extension and bending. A rolled electroactive polymer is well suited for use in self-contained unit 46 of FIG. 3. The polymer may be wrapped around the energy storage mass 64 and linear slide 66, which provides a compact form factor for self-contained unit 46 with numerous layers of electroactive polymer.

Other electroactive polymer devices are also suitable for use herein. In general, electroactive polymer transducers are not limited to any particular geometry or linear deflection. For example, a polymer and electrodes may be formed into any geometry or shape including tubes and rolls, stretched polymers attached between multiple rigid structures, stretched polymers attached across a frame of any geometry—including curved or complex geometries, across a frame having one or more joints, etc. Deflection of a transducer according to the present invention includes linear expansion and compression in one or more directions, bending, axial deflection when the polymer is rolled, deflection out of a hole provided in a substrate, etc. Deflection of a transducer may be affected by how the polymer is constrained by a frame or rigid structures attached to the polymer. Other electroactive polymer devices suitable for use herein are described in commonly owned U.S. Pat. No. 6,545,384, which is incorporated by reference herein in its entirety for all purposes.

In one embodiment, marine device 10 uses one or more commercially available electroactive polymer devices, such as those available from Artificial Muscle (AMI) of Menlo Park, Calif. In particular, AMI provides a universal muscle actuator, which is suitable for use herein. The universal muscle actuator includes two opposing diaphragm actuators attached to a common central platform. The narrow annular area of each diaphragm effectively couples much of the actuation stress to the central platform. Universal muscle actuators have been made in a range of sizes. The number of layers of the diaphragms may vary as well. While developed as an actuator, the universal muscle actuator may also operate as a generator. A universal muscle actuator employed as a generator may include a larger diameter to allow for the needed energy output.

A collection of electroactive polymer devices may be mechanically linked to form a larger generator with a common output, e.g. force and/or displacement. By using a small electroactive polymer as a base unit in a collection, conversion between electric energy and mechanical energy may be scaled according to an application by connecting many individual elements in parallel or series.

The buoy-mounted generator design of FIG. 5 may employ a long and narrow form factor for the electroactive polymer device(s). Vertically stacked electroactive polymer devices, such as rolled devices or universal muscle actuators, are two suitable electroactive polymer device approaches with such a long and narrow form factor. This approach is also suitable for use in mooring cables where the electroactive polymer device is disposed along the mooring cable and protected by a sheath.

The amount of electroactive polymer included in a marine device will depend on the amount of desired power for the marine device. In one embodiment, about 1 meter square of electroactive polymer film is used for each watt of power output desired. Thus, for typical wave frequencies, a 25-watt generator would employ about 25 $m^2$ of electroactive polymer. If, for example, the marine device 40 of FIG. 3 uses universal muscle actuators with an outer diameter of 30 centimeters and an inner diameter of 10 centimeters, each single-layer universal muscle actuator is about 0.063 $m^2$. This amounts to about 400 of these devices for 25 watts. Alternatively, if each universal muscle actuator includes ten layers of electroactive polymer, then the marine device 40 of FIG. 3 may only use 40 UMA devices. For the four self-contained unit 46 design of marine device 120 of FIG. 5, then each unit 46 only contain 10 universal muscle actuator devices.

In one embodiment, electroactive polymer transducers in marine device 10 are selected and configured to generate between about 5 joules and about 60 joules per stroke of a mass in mechanical energy transmission system 15. In a specific embodiment, generator 20 is selected and configured to generate between about 20 joules and about 30 joules per stroke of the mass. 20 joules per stroke translates to about 5 to 10 watts of power at typical bay wave frequencies. Of course, the size of electroactive polymer transducers in marine device 10 will vary with the number of mechanical energy transmission systems 15 used, the size of the mass(es) in each system 15, amount of energy in the waves, wave period, desired electrical energy performance of marine device 10, etc.

In order to increase energy density with dielectric elastomers, energy generation may be typically done at high voltage (1 kV or more). In one embodiment, an electroactive polymer generator system that is used to recharge a battery, for example, includes both step-up and step-down voltage conversion.

Figure 15:
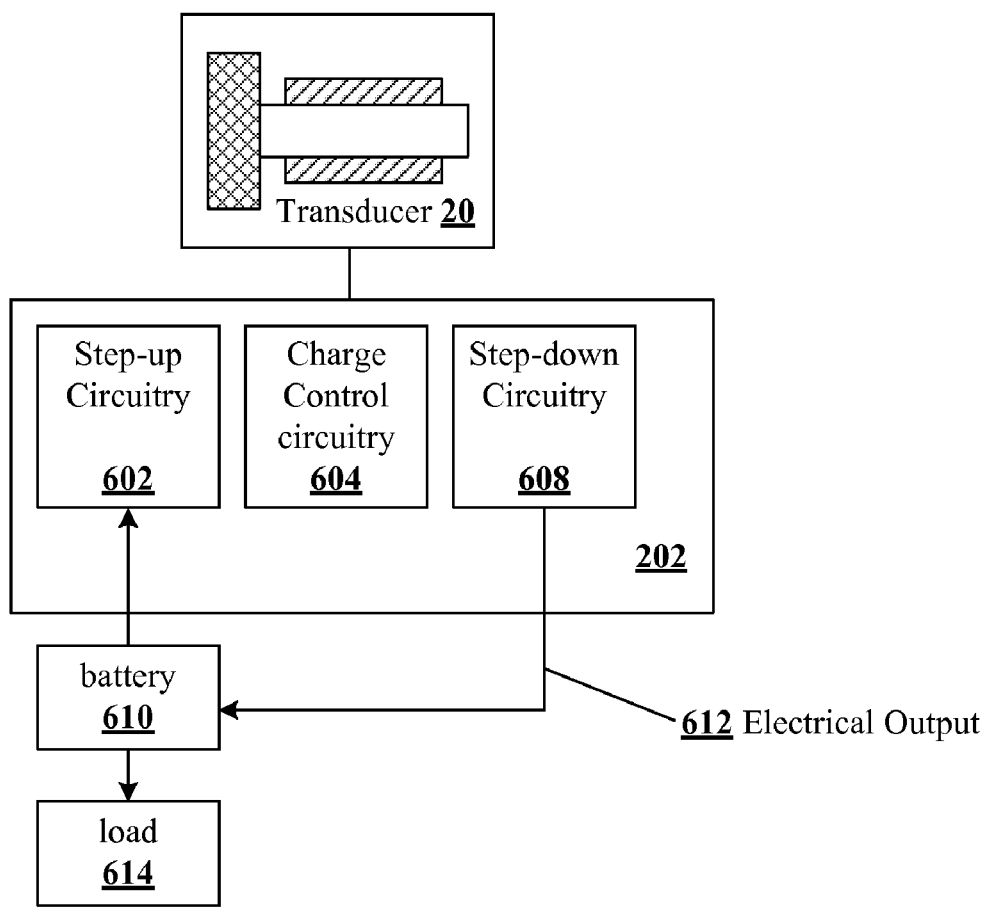
FIG. 15 is block diagram of a transducer connected to conditioning electronics.

FIG. 15 is block diagram of one or more transducers 20 connected to power conditioning electronics 202 including both step-up and step-down voltage conversion in accordance with a specific embodiment of the present invention. Functions performed circuits by power conditioning electronics 202 include: 1) voltage step-up performed by step-up circuitry 602, which may be used when applying a voltage to the transducer 20, 2) charge control performed by the charge control circuitry 604 which may be used to add or to remove charge from the transducer 20 at certain times of a cycle, 3) voltage step-down performed by the step-down circuitry 608 which may be used to adjust an electrical output voltage to electrical output 612. Voltage step-down 608 allows output of transducer 20 to be incorporated into load 614 (e.g., LEDs) driver circuits just like battery 610. In a specific embodiment, the voltage step-down 608 reduces the voltage to a level slightly above battery 610 (e.g., 12.7V instead of 12V) so that diodes can be used to control current and power flow.

Circuits described herein contemplate many techniques to drive load 614. In one embodiment, battery 610 and low voltage output 612 are switched in and out of load 614. Output 612 may thus go directly or indirectly to battery 610 and/or load 614. Another driving circuit suitable for use with an inductor circuit (see FIG. 18 for example) places load 614 in a discharge path of transducer 20. This places the electrical load "floating" in voltage (that is, its voltage varies depending on which part of the charge-discharge cycle the polymer transducer is at; alternately, one terminal of the loads can be fixed in voltage, such as to earth ground, and the rest of the circuit can float in voltage). This method has some limitations which may not be applicable for some loads, it does provide a simple, efficient and low cost method to drive a load with transducer 20. It is possible to power the load during charging as well, e.g., so the lights flash during charging and discharging. In some embodiments, electrical energy from the transducer 20 is taken for the load "off the top" simultaneous with energy transfer through the inductor so that the inductor does not need to handle this energy and can be sized smaller. In many inductor circuits, the inductor limits current flow, load does not draw too much power from conditioning electronics 202. Placing load 614 in a discharge path of transducer 20 also eliminates the need for step-down circuitry to power the load, such as numerous LEDs in series.

As shown, battery 610 is also used to provide a small bias voltage to electroactive polymer 20. Further description of conditioning electronics 202 suitable for use herein is provided in commonly owned U.S. Pat. No. 6,768,246, which is incorporated by reference in FIGS. 16A and 16B show two sample step-down circuits suitable for use in a marine device according to specific embodiments of the present invention.

Figure 16A:
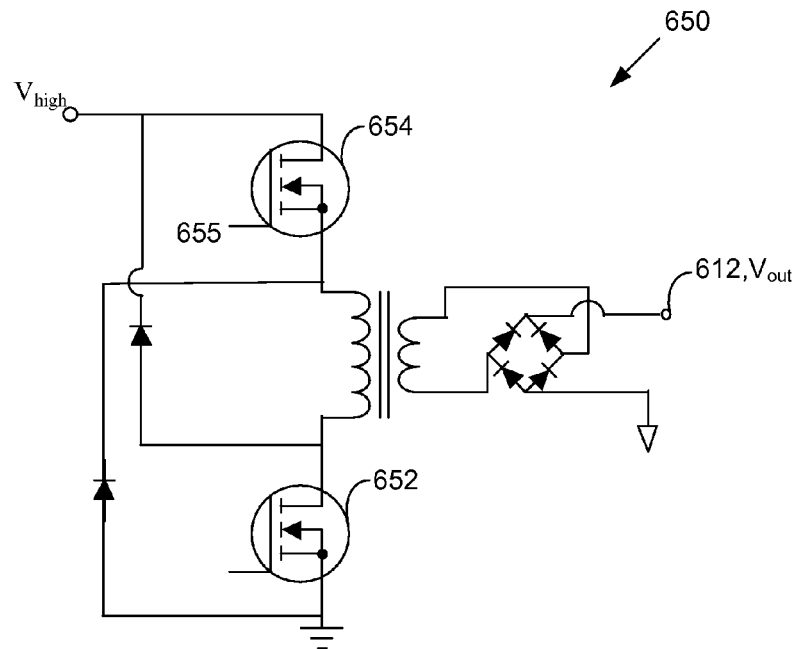
FIGS. 16A and 16B show two sample step-down circuits suitable for use in a marine device according to specific embodiments of the present invention.

FIG. 16A shows a simplified transformer step-down circuit 650 that includes two transistors 652 and 654. Transistor 652 is referenced to ground. Transistor 654 floats and uses isolated coupling to a switch 655 for external control. $V_{high}$ refers to the electroactive polymer voltage, while $V_{out}$ 612 refers to the output voltage. Controlled switching of transistors switches 652 and 654 drives the primary of the transformer, and the secondary of the transformer then provides low voltage AC output which is then rectified to provide DC or single polarity low voltage output $V_{out}$ 612.

Figure 16B:
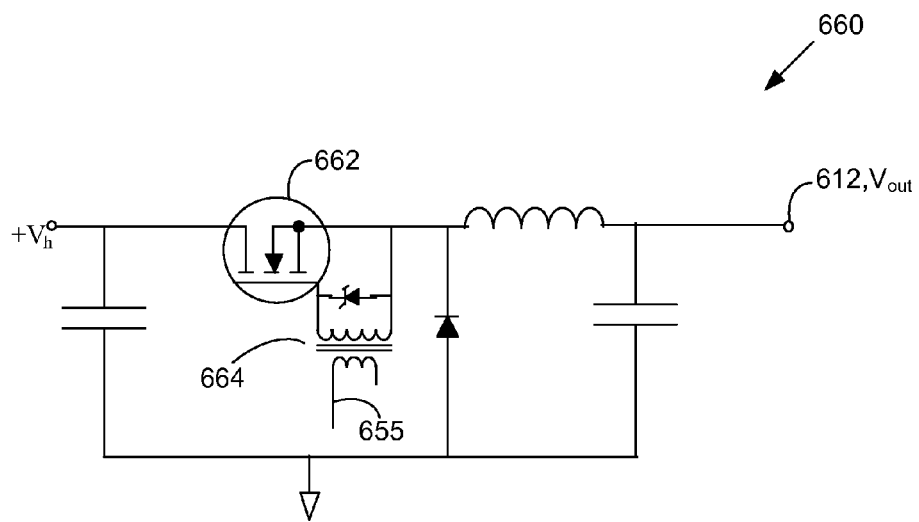

FIG. 16B shows a simplified inductor step-down circuit 660 (or buck circuit). High voltage transistor switch 662 floats in voltage, while isolation transformer 664 couples to a switch for external control. Again, $V_{high}$ refers to the electroactive polymer voltage, while $V_{out}$ 612 refers to the output voltage. A control or timing circuit, not shown, pulses the primary of isolation transformer 664. The resulting voltage on the secondary of transformer then turns on transistor 662, thereby allowing current to flow through the inductor. Current flow through the inductor, together with the diode connected to ground, provides low voltage output $V_{out}$ 612 in a buck circuit arrangement. The capacitors on the left and right hand side of the circuit smooth out the electrical loading and can be omitted in many cases. The transistor switch 662 turns off either by natural decay of the secondary voltage on transformer 664, when the energy of the EPAM and load capacitor (near Vhigh on the left) is depleted, or when a counter pulse is applied by the timing or control circuit to explicitly turn the transistor 662 off. For high frequency switch where energy is transferred in small amounts many times per second, a counter pulse is preferred, whereas if all the energy can be efficiently (i.e. the inductor or switch can efficiently handle the current) transferred in one pulse then a natural turn off may be satisfactory.

In general, inductor step-down circuit 660 is simpler, but transformer step-down circuit 650 may be more efficient with higher step-down ratios.

Electroactive polymer generators may employ other harvesting and conditioning circuitry 202 to assist energy collection. Two suitable energy collection circuit designs include inductive charge pump circuits and capacitive charge pump circuits.

Figure 17A:
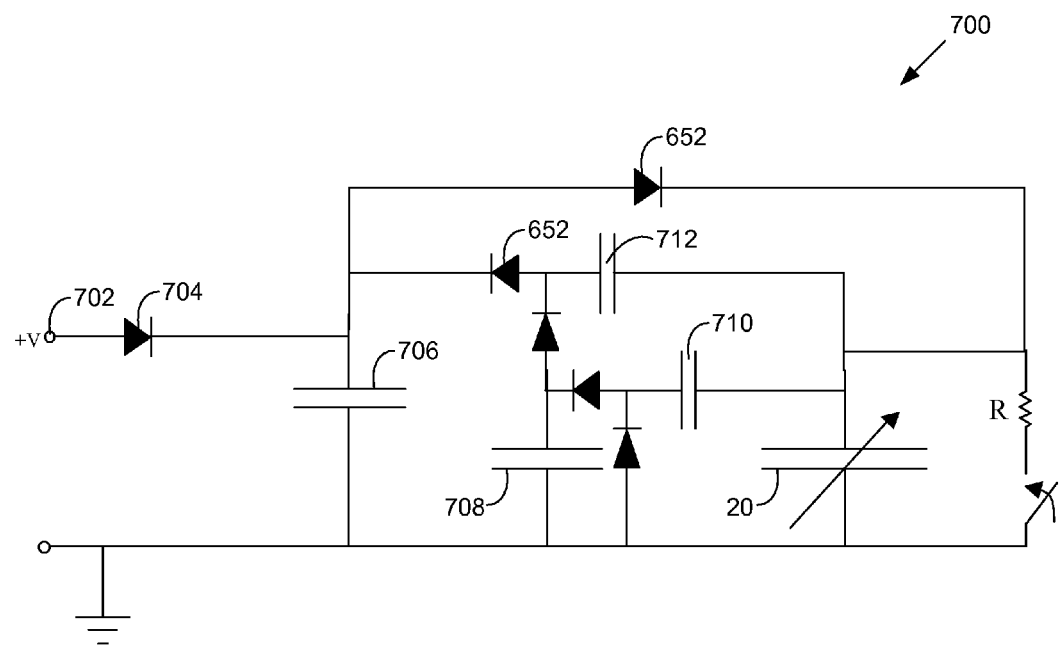
FIGS. 17A and 17B show a capacitive charge pump harvesting circuit in accordance with a specific embodiment of the present invention.

FIG. 17A shows a capacitive charge pump harvesting circuit 700 in accordance with a specific embodiment of the present invention. Harvesting circuit 700 is relatively simple, requires no switching, and works well with a wide range of electroactive polymer strains (or voltage gains due to capacitance variation).

Harvesting circuit 700 uses an input voltage 702 that initially charges the circuit at a low voltage, such as 12V or some other standard input. After the initial charge is placed on circuit 700, electroactive polymer transducer 20 pumps up the voltage. Diode 704 prevents backflow as the system charges up. Buffer capacitors 706 and 708 store high voltage energy. Coupling capacitors 710 and 712 transfer energy from the EPAM to the buffer capacitors 706 and 708. R represents the load and useful work for harvesting circuit 700. Capacitance for these capacitors is selected to be larger than the largest electroactive polymer capacitance.

Figure 17B:
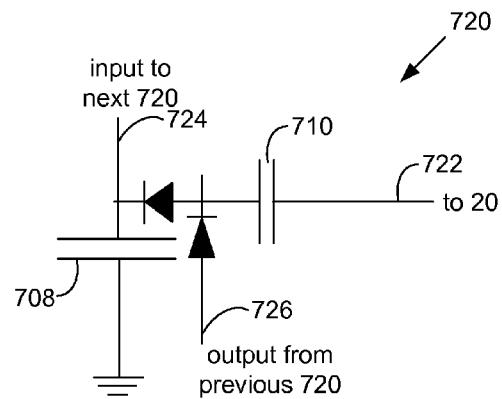

As shown separate in FIG. 17B, harvesting circuit 700 includes a repeating unit 720 that may be used to permit multiple electroactive polymer transducers 20 to function in circuit 700. This cumulatively adds the contributions from each electroactive polymer transducers 20. In this case, each repeating unit 720 includes an output 722 to an electroactive polymer 20, a coupling capacitor 710, a buffer capacitor 708, an input 724 to another repeating unit 720, and an output 726 from a previous repeating unit 720 (or ground if this is the first repeating unit 720 in the series).

Figure 18:
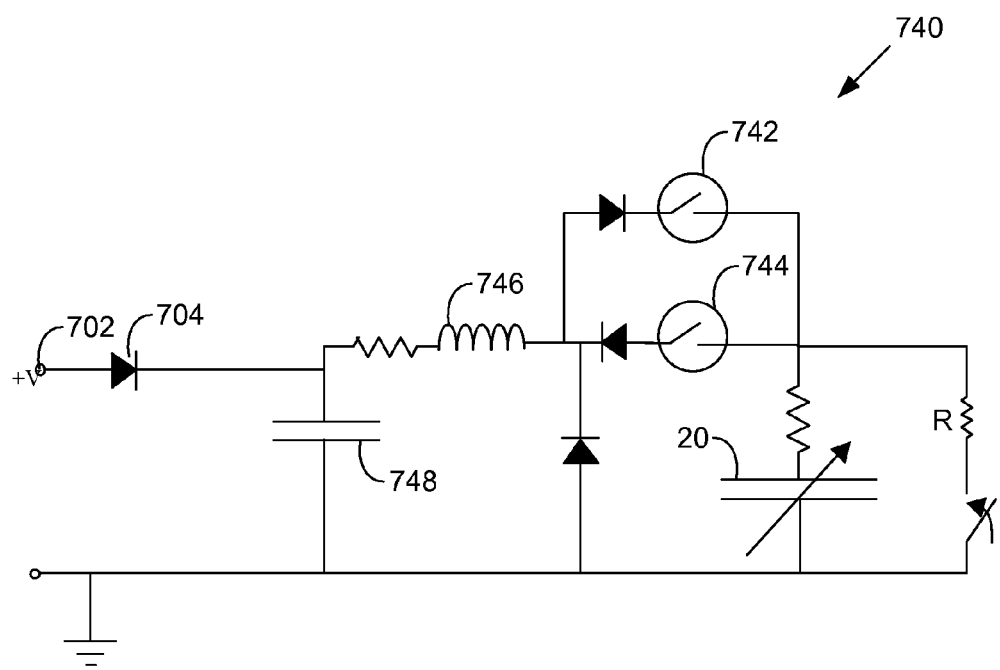
FIG. 18 shows an inductive charge pump harvesting circuit in accordance with another specific embodiment of the present invention.

FIG. 18 shows an inductive charge pump harvesting circuit 740 in accordance with another specific embodiment of the present invention. Harvesting circuit 740 is more efficient but employs switching and higher and more consistent strain inputs from the electroactive polymer.

Inductive circuit 740 similarly uses an input voltage 702 that initially charges the circuit at a low voltage. Also, after the initial charge is placed on circuit 700, electroactive polymer transducer 20 pumps up the voltage in circuit 740. Diode 704 prevents backflow as the system charges up. R again represents the load and useful work for harvesting circuit 740. Inductive circuit 740 also includes an inductor 746 and a buffer capacitor 748. Inductor 746 includes an inductance suitable to handle the maximum stored electrical energy of the EPAM. Generally speaking, one selects the inductance L to ideally achieve T1<<T2, and T3<<T4 where T1 is the RC time constant of the electroactive polymer based on the electrode resistance and the capacitance of the electroactive polymer (the natural decay time of the EPAM), T2 is ½ the LC time constant of the inductor-capacitance circuit taking C as the minimum EPAM capacitance (roughly, $T2=\pi\{(LC)^{0.5}\}$), T3 is ½ the LC time constant taking C as the maximum electroactive polymer capacitance, and T4=L/Rs where Rs is the total series resistance including the inductor's resistance, electrode resistance, and parasitic resistance through the diodes and switches (in the on state). An inductance in the range of 1 mH to about 1 H is suitable in many embodiments, and usually selected relative to capacitance of the electroactive polymer.

In operation, switch 742 closes briefly to charge electroactive polymer transducer 20 in a stretched state (a higher capacitance). After charging, switch 742 opens again. Switch 744 then closes briefly to discharge electroactive polymer transducer 20 while in a contracted state (a lower capacitance). After charging, switch 744 opens again.

Harvesting and conditioning circuitry 202 using inductive circuit thus switches the electroactive polymer voltage on/off. This switching may be done with mechanical contacts or electrically with a control signal, for example. In a specific embodiment, the mechanical contacts are arranged at maximum and minimum stroke positions to automatically inform conditioning circuitry 202 of stroke status at these points. Switching with high-voltage transistors is also suitable. Sensors that indicate when the electroactive polymer is at its extreme positions may also be used.

Inductive circuit 740 works efficiently when the electroactive polymer stretches and contracts a large amount. Various mechanical transmission schemes and/or electrical tuning can be configured to help one or more electroactive polymers operate at large strain conditions. For example, a mechanical energy transmission system 15 may be configured to allow for lower stiffness and fast electroactive polymer response.

Figure 19A:
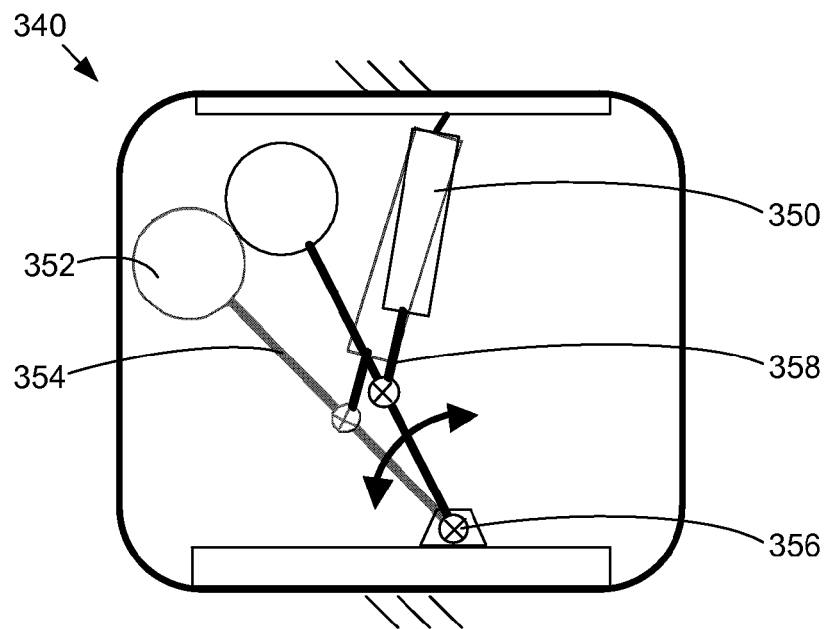
FIGS. 19A and 19B show a self-contained unit that includes a mechanical energy transmission system with a swinging mass designed for use with an electroactive polymer generator in accordance with a specific embodiment of the present invention.
Figure 19B:
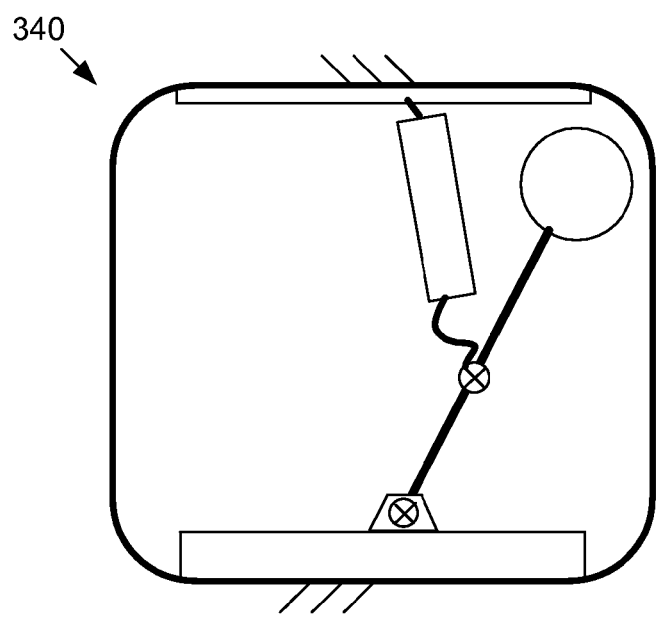

FIGS. 19A and 19B show a self-contained unit 340 that includes a mechanical energy transmission system with a swinging mass 352 designed for use with an electroactive polymer generator 350 in accordance with a specific embodiment of the present invention.

In this case, movement of the marine device results in back and forth swinging of mass 352 about a pivot 356. Self-contained unit 340 provides a negative spring constant using an inverted pendulum or over-center mechanism when a spring is added. Electroactive polymer 350 couples to a pendulum arm 354, attached to mass 352, such that electroactive polymer 350 deflects as mass 352 swings. Deflection of electroactive polymer 350 is used to generate electrical energy. Also, electroactive polymer 350 provides stiffness to the system, including a controllable stiffness in some embodiments, as described above.

This self-contained unit 340 converts both up and down and tilting (or rocking) motion of a marine device 10 in the water into motion of mass 352. In other words, self-contained unit 340 provides a means of coupling angular and lateral motion (in addition to vertical motion) in a single device. Self-contained unit 340 also provides frequency doubling (the electroactive polymer 350 stretches and relaxes twice when the pendulum goes through top point), which is of use in low frequency wave environments. A slack cable 358, attached to inverted pendulum, adds a non-linear spring that allows for fast expansion and contraction of electroactive polymer 350, thereby reducing leakage losses in the electroactive polymer. Frequency doubling allows a single wave cycle to produce two cycles of expansion and contraction of the electroactive polymer 350. Thus, only half the amount of electroactive polymer material would be needed to produce the same power output (alternatively the same amount of material could be operated at a lower voltage or strain).

The electrical power generated by an electroactive polymer generator is typically at high voltage. The high voltage electrical energy can be: used directly (such as for flashing lights), stored at a high voltage on a capacitor, and/or to recharge batteries. The electronic generation circuit may also include the ability to step-down the high voltage. A simple inductive step-down circuit known as a "buck" circuit is suitable for step-down in many instances.

Other Marine Devices

This section describes other marine devices and applications that may benefit from a mechanical energy transmission system 15 and electroactive polymer generator 20.

One such marine device is a marine generator deployed specifically for electrical energy production. For generators located near a shore, wave power can be used to supply energy to installations located near the shore. These installations might include navigational lighting located on seawalls or breakwaters. The electricity could also be used to supply industries that are located near the shore or on islands and thus relieve the need to transmit electricity long distances or over water. Wave power, since it does not require any fuel source or produce any effluents, can also be used to supply clean energy for general needs.

The location of the wave power electrical generation device near an existing or planned breakwater or seawall is attractive because the functions are complementary. The wave power device will tend to calm the waves hitting the seawall or breakwater. The breakwater or seawall can help amplify the waves of the device since some waves are reflected. The seawall or breakwater also can serve as a desirable anchor point for the generator device.

In one specific application, the marine device is a floating breakwater generation device that harvests power in large waves found in deep-water areas of a coastline or near an existing breakwater or similar seawall structure in shallower waters. For the Japanese coastline for example, these waves frequently include a 2-meter peak-to-trough average wave height with a 7 to 8 second period. A marine generator as described herein may also be located adjacent to existing or specially made seawalls and breakwaters in other locations. Because of its location, the marine generator may also help protect the seawall or breakwater from erosion.

Electrical power from the generator may be used to power navigational lighting on the nearby seawall or breakwater—or used for a variety of general needs, such as supply onto an electrical grid. For supply onto a grid, the marine device also includes a tether or other form of electrical communication that transports the generated electrical energy from the floating marine device to a gird connection. The power may also be used to power other marine or aviation navigational aids, generate power for nearby buildings, or for transmission to more remote locations.

Figure 20:
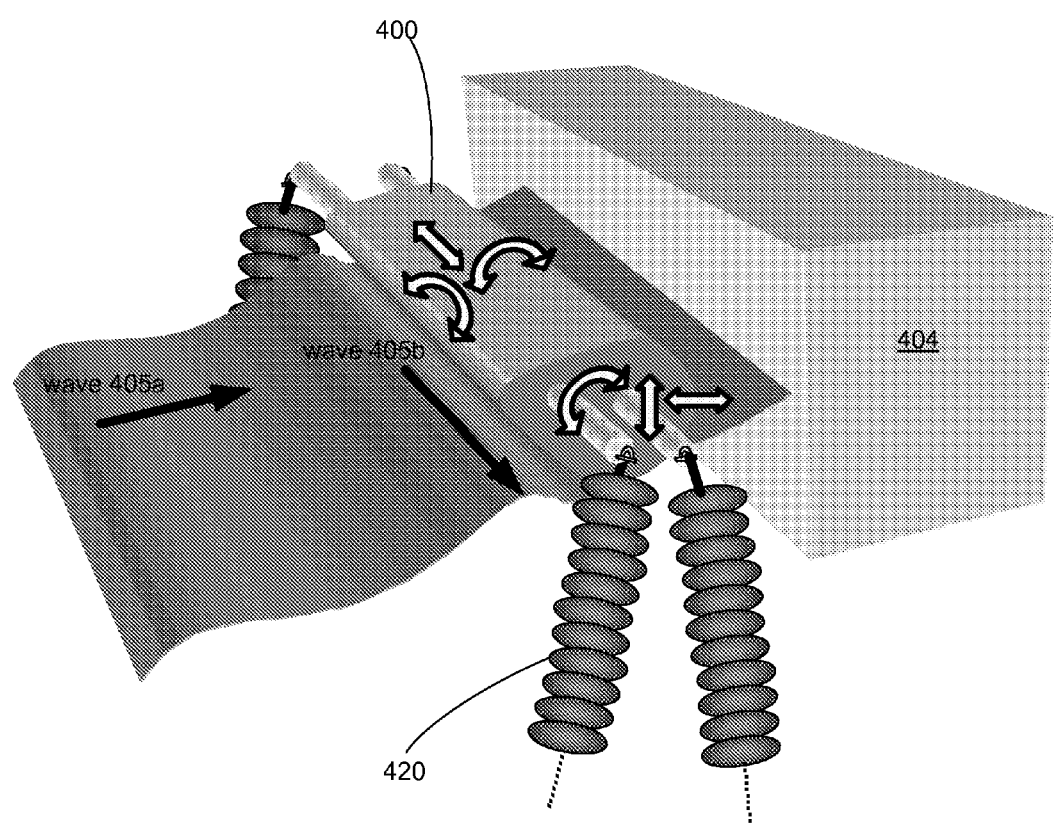
FIG. 20 shows marine device in front of a sea wall and configured to receive an incoming wave normal to an axis of the marine device.
Figure 21A:
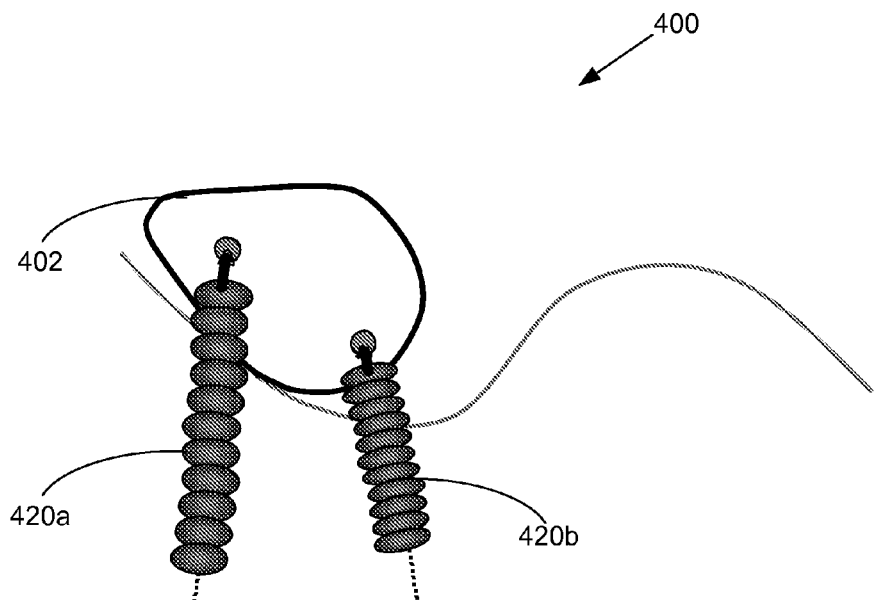
FIGS. 21A and 21B show marine device with mooring lines in two rotational positions in accordance with a specific embodiment of the present invention.
Figure 21B:
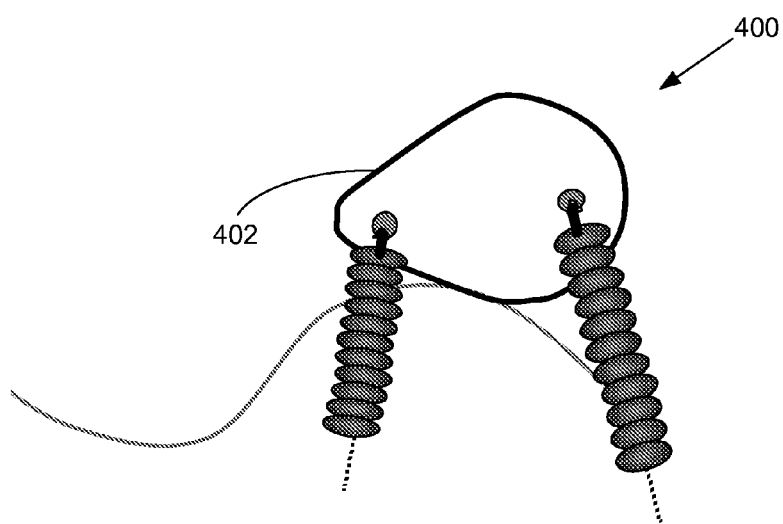

FIGS. 20-21 show a marine device 400 in accordance with a specific embodiment of the present invention. FIG. 20 shows marine device 400 in front of a sea wall 404 and configured to receive an incoming wave 405a normal to a long axis of the marine device 400. FIGS. 21A and 21B show marine device 400 with mooring lines 420 for two rotational positions of marine device 400 in accordance with a specific embodiment of the present invention.

As mentioned above, many marine devices described herein may include a mechanical transmission system that does not include an energy storage mass that moves relative to the body for electrical energy harvesting. In this case, the. In this case, breakwater generator device 400 generates electrical energy using wave power, and includes a mechanical energy conversion system that includes a floatation chamber 402 coupled to mooring lines 420.

Flotation chamber 402 is configured such that device 400 at least partially floats on water. Flotation chamber 402 converts the wave energy into mechanical energy along one or more known directions, namely, the rotation of flotation chamber 402 about its long axis (normal to the page in FIG. 21A). Flotation chamber 402 may include an inflatable plastic or foam coated with concrete or plastic, for example. The outer shape of flotation chamber 402 reacts to wave motion and changes in the surface level of water on which the generator device 400 floats. In this case, flotation chamber 402 includes an axial profile shown in FIG. 21A that reacts to water surface level changes moving normal to the axis (see FIG. 20). An incoming wave thus causes flotation chamber 402 to rotate about its long axis and tilt back and forth, as shown in FIGS. 21A and 21B.

Mooring lines 420 attach to front and back portions of flotation chamber 402 on opposite sides of the center of mass of flotation chamber 402. Rotation of flotation chamber 402 about its axis causes mooring lines 420 to stretch and contract (see FIGS. 21A and 21B). In a specific embodiment, mooring lines 420 each include one or more electroactive polymer generators that convert linear deflection of mooring lines 420 into electrical energy. In this case, and as shown in FIG. 21A, mooring lines 420 include a rigid cable that couples to the bottom of an electroactive polymer device that couples at its top end to another rigid cable and flotation chamber 402. Rolled electroactive polymers are suitable for use in mooring lines 420. Concatenated electroactive polymers may also be stacked in series to provide electroactive polymer devices with lesser length. In this case, a rubber or metal sealed bellows may be added to mooring lines 420 to cover, seal and protect the electroactive polymer devices.

By using mooring lines 420a and 420b on opposing sides of each flotation chamber 402 (see FIG. 21A), and on opposing ends (see FIG. 20), the electroactive polymer devices can stretch and contract with several different motions of chamber 402 (height increase, rolling and tilting, for both incoming waves 405a and transverse waves 405b, etc.), allowing device 400 to generate power with almost any wave direction and water surface level change.

Figure 22A:
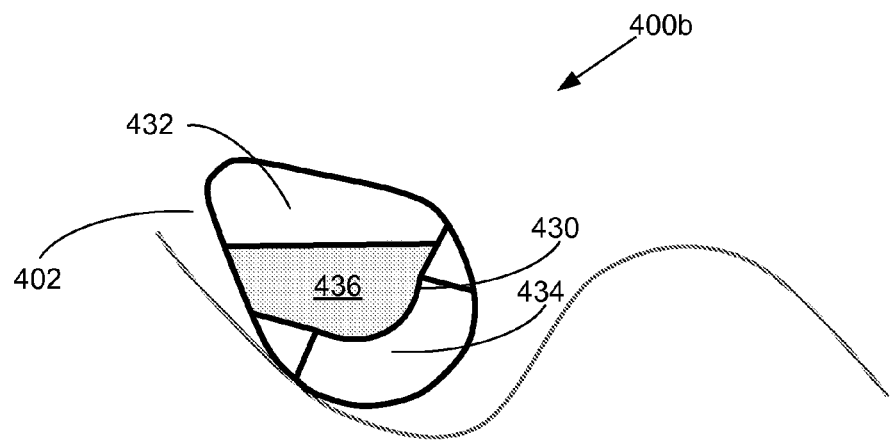
FIGS. 22A and 22B show a marine device in two rotational positions in accordance with another specific embodiment of the present invention.
Figure 22B:
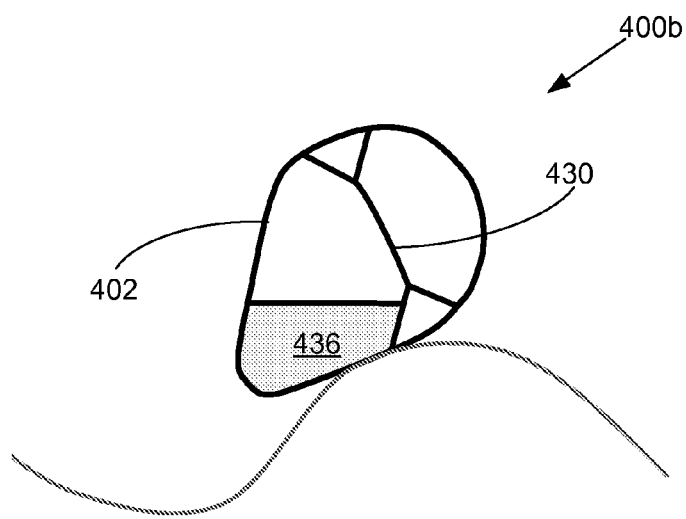

FIGS. 22A and 22B show a marine device 400b in two rotational positions in accordance with another specific embodiment of the present invention. Marine generator 400b includes an internal electroactive polymer 430 that separates two internal cavities 432 and 434. Internal cavity 432 includes a liquid 436, such as water. Rotation of marine device 400b—in response to changing surface levels of the water or a passing wave as shown—causes the marine device 400b to rotate and liquid 436 to move in chamber 432 so as to intermittently push on a diaphragm electroactive polymer 430 (FIG. 22A), which causes polymer 430 to stretch.

Electrical control circuitry then monitors the state of deflection of polymer 430, and adds and removes current to and from polymer 430 according to the deflection state of diaphragm polymer 430. In a specific embodiment, the electroactive polymer 430 communicates with circuitry that senses the deflection state of polymer 430. Sensing using an electroactive polymer is described in commonly owned U.S. Pat. No. 6,809,462, which is also incorporated by reference in its entirety herein for all purposes.

Another embodiment of marine device 400b includes liquid 436 in the second cavity 434. This allows the liquid 436 to push on polymer 430 when in the position shown in FIG. 22B, which powers polymer 430 for rotational movement of marine device 400 in both clockwise and counterclockwise directions.

In another embodiment of marine device 400b, internal cavities 432 and 434 form outer cavities about an inner cavity in marine device 400b that internally includes liquid 436. In some cases, this may double mechanical energy transmitted to the polymer (and potentially double the electrical energy harvested).

A marine generator 400 may include both electroactive polymer 430 and mooring lines 420. This allows the device 400 to generate electrical energy for almost any chamber 402 motion including any translation or rotation of the device. This includes waves that move normal 405a to the wall 404 from the front or reflect from behind, as well as transverse waves 405b (FIG. 20).

Figure 23A:
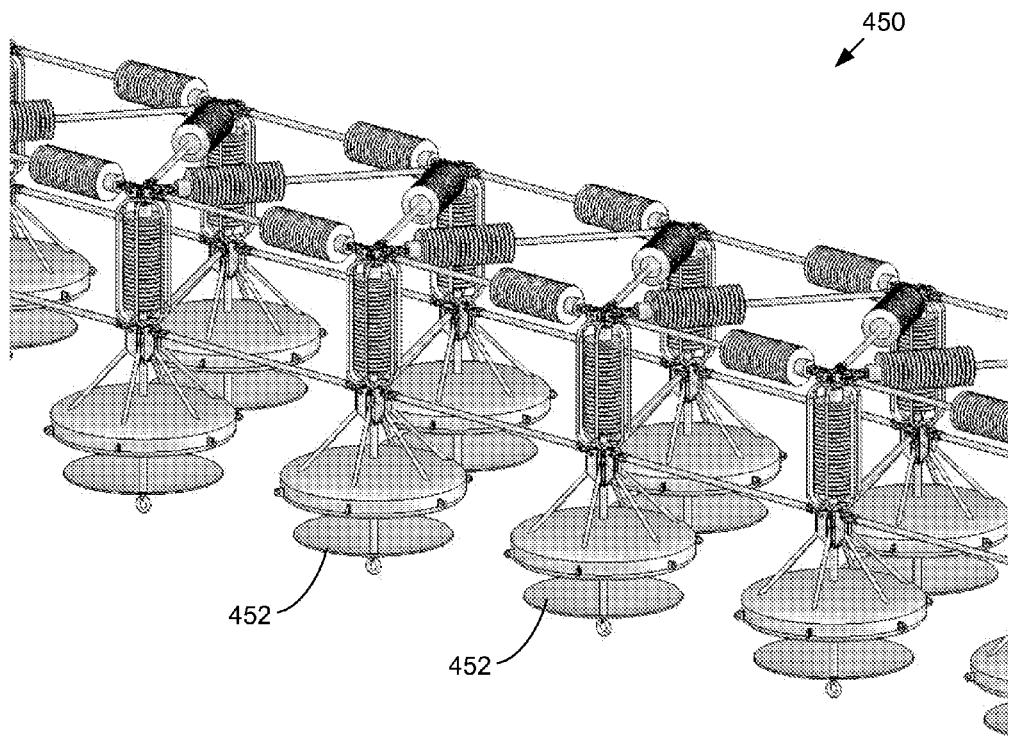
FIGS. 23A-23C show a breakwater generator system in accordance with another embodiment of the present invention.
Figure 23B:
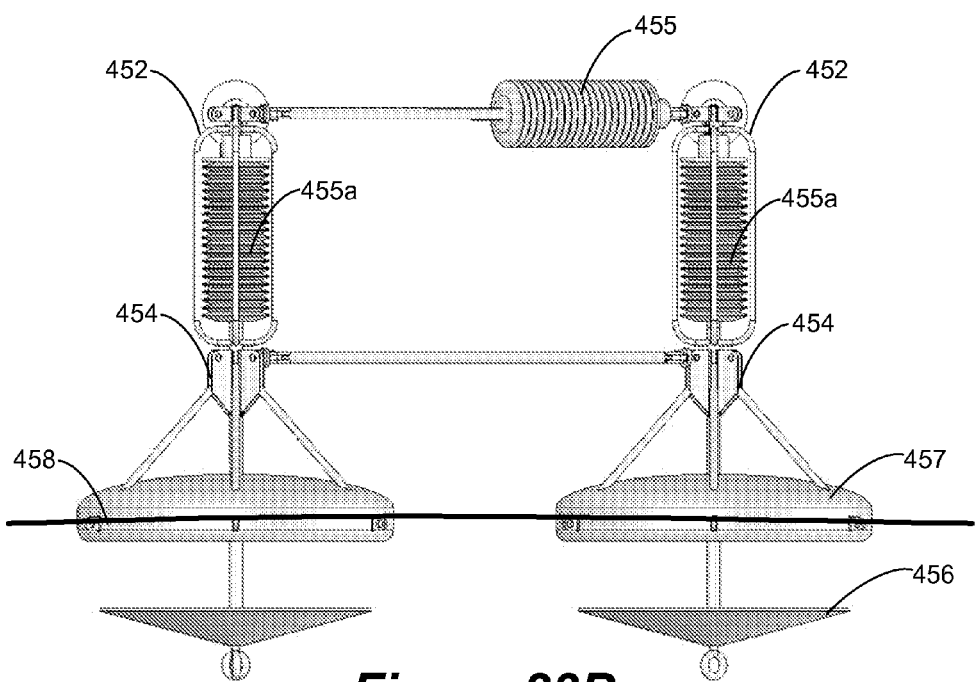
Figure 23C:
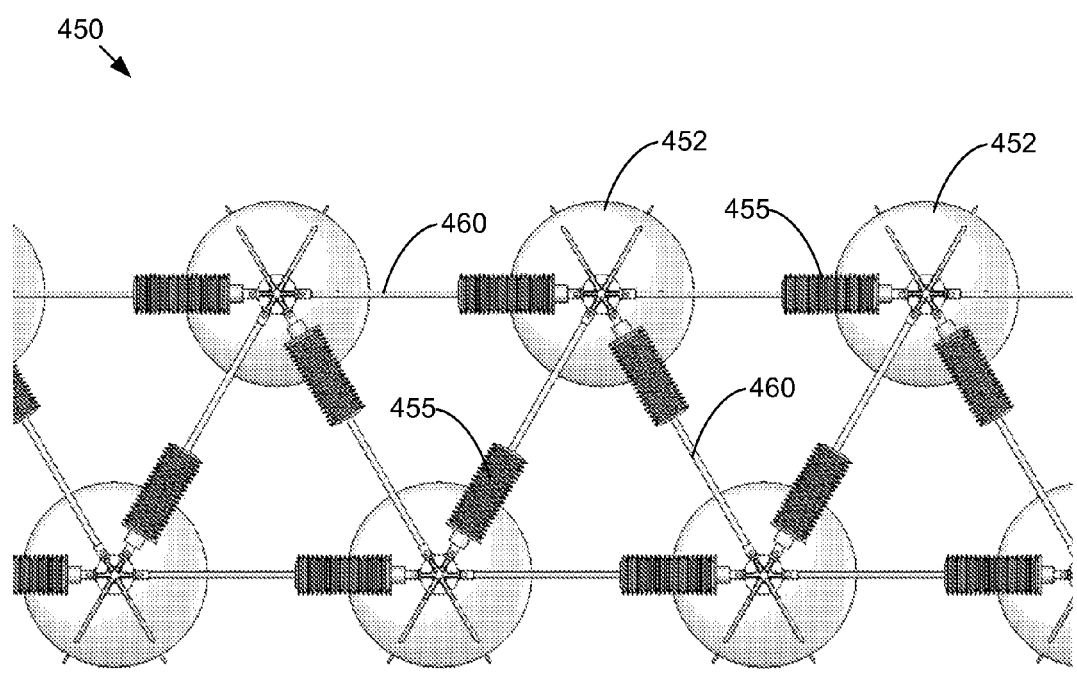

FIGS. 23A-23C show a breakwater generator system 450 in accordance with another embodiment of the present invention. FIG. 23A shows a perspective view of system 450; FIG. 23B shows a side view of two adjacent generators 452 used in system 450; and FIG. 23C shows a top view of interconnection between generators 452 in system 450.

Referring first to FIG. 23B, each generator 452 includes a frame 454, water brake 456, float 457, and at least one mechanical energy transmission system 455.

Water brake 456 attaches to a bottom portion of frame 454, rests under water surface level 458 when the generator is deployed, and resists vertical motion of each generator 452.

Mechanical energy transmission system 455a is vertically aligned with respect to frame 454 and includes a portion that mechanically couples to water brake 456 and a second portion that mechanically couples to a portion of frame 454 that rests above the water surface level 458. A changing water surface level 458 creates differential vertical motion in mechanical energy transmission system 455a, and a generator attached thereto. In one embodiment, mechanical energy transmission system 455a includes a rod that mechanically couples to water brake 456 and vertically translates relative to frame 454. This relative motion is used to generate electrical energy with a generator coupled to a portion of mechanical energy transmission system 455. For example, one portion of an electroactive polymer may be coupled to the rod in mechanical energy transmission system 455 while another portion of the electroactive polymer couples a stationary portion of mechanical energy transmission system 455 (stationary relative to frame 454) or to frame 454. In a specific embodiment, frame 454 includes a metal or stiff plastic, while water brake 456 may include coated styrofoam, a metal, stiff polymer, fiberglass or cement for example.

Generator system 450 also harvests relative motion between generators 452. A lattice structure mechanically couples generators 452 in system 450, and is shown from the top in FIG. 23C. The lattice structure includes an array of connectors 460. In this case, the connectors 460 are linear and couple two adjacent generators 452; other connection designs are also suitable for use. One or more linear connector 460 in the lattice structure includes a mechanical energy transmission system 455 that couples to two adjacent generators 452 such that relative motion between the adjacent two generators 452 deflects two portions of the mechanical energy transmission system 455 with relative motion. For example, a rod or one end of transmission system 455 may mechanically couple to the frame 454 of a first generator 452 while a plunger or the other end of transmission system 455 mechanically couples to the frame 454 of a second adjacent generator 452. Relative lateral motion between the adjacent generators 452 then causes deflection in mechanical energy transmission system 455, which may then be harvested along its known deflection for electrical energy production.

The lattice in system 450 is suitable to capture motion via: a) relative lateral motion between generators 452 (e.g., in a plane horizontal to the water), b) relative rocking motion between generators 452, c) relative vertical motion between generators 452, and d) combinations thereof. Since wave motion is generally unpredictable, an advantage of system 450 is that it harvest three dimensional motion in the waves regardless of the direction of motion, which allows the system to harvest wave energy despite the unpredictability of the wave motion and its affect on the individual generators 452.

System 450 is modular. This allows system 450 to be easily scaled in the number of generators 452—and aggregate electrical output—to a particular application. FIG. 23A shows a continuum of generators 452, which may extended in length to form long chains, as desired. Generators 452 may also be replicated to form large area "patches" that are several generators 452 wide, as well as several generators long. The size and shape of system 450 may also be adapted to local topography and wave conditions. For example, adding generators 452 increases reaction forces on mechanical energy transmission system 455 due to inertial effects of the entire system, which permits greater electrical energy production in rough marine environments.

In one embodiment, system 450 includes a redundant number of generators 452. This redundant design permits system 450 to: a) harvest more energy from a given area of the sea, and/or b) harvest less energy but include fault tolerance in system 450 to accommodate one (or more) generator 452 malfunctions.

System 450 may also be expanded upon or repaired after initial deployment. Self-contained units 46 and many other moving parts in each generator 452 are located above the water line 458, where they can be easily built or serviced (including replacement).

The breakwater generators 400 and 450 may be flexibly located. Placement in front of an existing breakwater or seawall 404 allows the generator 400 to make use of reflected waves for added response. Breakwater generator 400 is also modular and thus able to operate one small unit or many units depending on power needs; flotation chambers 402 and mooring cables 420 can be added in series along the wall 404 to allow for different amounts of power generation. Additional lines may also be disposed in parallel lines in a direction normal to wall 404. System 450 has a similar number of mooring options. Each water brake 456 can be moored to the seafloor or breakwater or only a few of the water breaks could be moored to the sea floor.

Other marine devices that may benefit from a mechanical energy transmission system and generator described herein include guides for a shipping lane, wave attenuators that are configured to diminishing wave energy, floating barriers, or any floating marine device.

Methods

Figure 24:
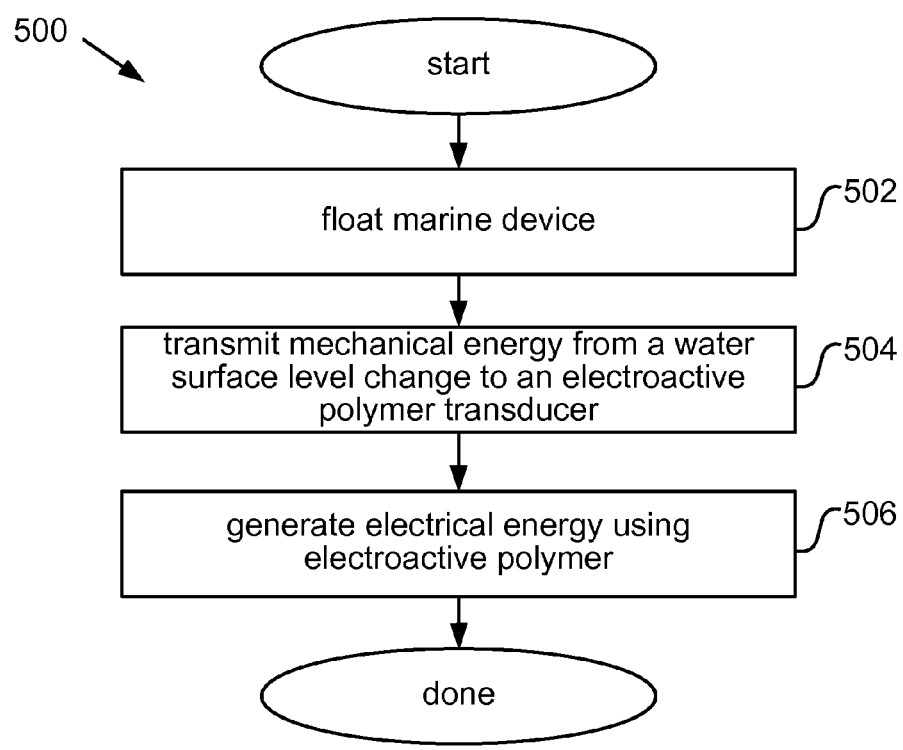
FIG. 24 shows a method of generating electrical energy in accordance with one embodiment of the present invention.

The present invention also relates to methods of generating electrical energy in a marine device. FIG. 24 shows a method 500 of generating electrical energy in accordance with one embodiment of the present invention.

Method 500 begins with floating the marine device on water such that a portion of the body rests above a water surface level when the marine device floats on the water (502). The marine device includes a mechanical energy transmission system and an electroactive polymer generator. In one embodiment, the mechanical energy transmission system and electroactive polymer generator are included in a self-contained unit that is added to the marine device long after its initial deployment. In a specific embodiment, the marine device is custom made with the mechanical energy transmission system and electroactive polymer generator added during manufacture. The marine device is configured such that a portion of its body rests above a surface level of water when the marine device floats in the water.

The mechanical energy transmission system then transmits mechanical energy from water to electroactive polymer generator (504). This occurs when the water surface level changes and a portion of a mechanical transmission system moves relative to the marine device body in response to the water surface level change. As described above, the moving portion may include a proof mass or a rod (e.g., attached to a water brake in the water) that moves relative to the marine device body when the water surface level changes. For example, the marine device may rise when the water surface level rises, albeit at different rate or to different level than the moving portion. Alternatively, the marine device may tilt when the water surface level changes, which causes differential motion in the proof mass or rod relative to the body. Tilting in this sense refers to any rotation or rocking of the device from its position before the wave disturbance.

An energy storage mass or rod moves relative to the body typically because there is a degree of freedom between the energy storage mass or rod and the marine device body. In one embodiment, the energy storage mass moves along a single degree of freedom, such as a linear slide or via a rotational joint. In another embodiment, a stiffness associated with the energy storage mass is designed and configured such that resonant frequency of the mechanical energy transmission system is about equal to the marine device. This dynamic vibration absorption increases motion of the energy storage mass—which increases the amount of harnessed mechanical energy available for conversion to electrical energy. In another specific embodiment, the stiffness is tunable and matched reactively in real time by a control circuit to provide a resonant frequency for the mechanical energy transmission system that is about equal to the marine device.

In other embodiments an energy storage mass is not used. Instead the waves produce a displacement between two ends of an electroactive polymer generator. This displacement is used to generate electricity.

Many of the mechanical energy transmission systems and generators described above are suitable to capture and convert wave energy despite the variance and inconsistency in water surface level changes between waves. The present invention is thus well suited to handle varying and inconsistent water surface level movements and waves with varying properties, such as those found in choppy water conditions.

Electrical energy is then generated using the electroactive polymer generator and relative motion between the moving portion and the marine device body (506). The electrical energy may be used immediately, converted in voltage, and/or stored for subsequent use.

While this invention has been described in terms of several preferred embodiments, there are alterations, permutations, and equivalents that fall within the scope of this invention which have been omitted for brevity's sake. By way of example, although the present invention has been described in terms of several polymer materials and geometries, the present invention is not limited to these materials and geometries. It is therefore intended that the scope of the invention should be determined with reference to the appended claims.

What is claimed is:

1. A marine device comprising:
a body, wherein the marine device is configured such that a portion of the body rests above a surface level of water when the marine device floats in the water;
a mechanical energy transmission system configured to convert mechanical energy resulting from a change in the water surface level to mechanical energy regulated by the mechanical energy transmission system; and
an electroactive polymer transducer operably coupled to a portion of the mechanical energy transmission system and configured to produce electrical energy using the regulated mechanical energy in the mechanical energy transmission system, the electroactive polymer transducer including an electroactive polymer and one or more electrodes coupled to the electroactive polymer.

2. The marine device of claim 1 wherein the mechanical energy transmission system includes an energy storage mass that is configured to move relative to the body in response to a water surface level change that causes movement of the body relative to the water surface level.

3. The marine device of claim 2 wherein the energy storage mass is slideably coupled to a linear axis and the electroactive polymer transducer is configured to produce electrical energy using kinetic energy of the energy storage mass along the linear axis.

4. The marine device of claim 2 further comprising a spring mechanically coupled to the energy storage mass and mechanically coupled to the body.

5. The marine device of claim 4 wherein the spring includes a tunable stiffness.

6. The marine device of claim 5 wherein the electroactive polymer transducer is configured to contribute to the tunable stiffness.

7. The marine device of claim 5 wherein the spring includes a stiffness that provides a resonant frequency for the mechanical energy transmission system within about 1 Hertz of a resonant frequency for the marine device.

8. The marine device of claim 1 further comprising a second electroactive polymer transducer operably coupled to a) the portion of the mechanical energy transmission system and configured to produce electrical energy using the regulated mechanical energy in the mechanical energy transmission system or b) a frame included with the first electroactive polymer transducer, the second electroactive polymer transducer including a second electroactive polymer and at least two electrodes coupled to the second electroactive polymer.

9. The marine device of claim 1 further comprising conditioning electronics in electrical communication with the at least two electrodes and designed or configured to add or remove electrical energy from the electroactive polymer transducer.

10. The marine device of claim 4 wherein the electroactive polymer is a dielectric elastomer.

11. The marine device of claim 4 wherein the polymer has an elastic modulus below about 100 MPa.

12. A buoy comprising:
a body, wherein the buoy is configured such that a portion of the body rests above a surface level of water when the buoy floats in the water;
a mechanical energy transmission system configured to convert mechanical energy resulting from a change in the water surface level to mechanical energy regulated by the mechanical energy transmission system;
an electroactive polymer transducer operably coupled to a portion of the mechanical energy transmission system and configured to produce electrical energy using the regulated mechanical energy in the mechanical energy transmission system, the electroactive polymer transducer including an electroactive polymer and one or more electrodes coupled to the electroactive polymer; and
a light adapted to use electrical energy produced by the electroactive polymer transducer.

13. The buoy of claim 12 wherein the mechanical energy transmission system and the electroactive polymer transducer are contained in an internal cavity that is configured to be added to the buoy after deployment of the buoy.

14. The buoy of claim 12 wherein the mechanical energy transmission system includes an energy storage mass that is configured to move relative to the body in response to a water surface level change that causes movement of the body relative to the water surface level.

15. The buoy of claim 12 further comprising conditioning electronics in electrical communication with the at least two electrodes and designed or configured to add or remove electrical energy from the electroactive polymer transducer.

16. The buoy of claim 15 wherein the conditioning electronics include an inductive circuit including at least one inductor and configured to harvest electrical energy from the electroactive polymer for each stroke of the electroactive polymer.

17. The buoy of claim 15 wherein the conditioning electronics include a capacitive circuit including at least one capacitor and configured to harvest electrical energy from the electroactive polymer for each stroke of the electroactive polymer.

18. The buoy of claim 15 wherein the conditioning electronics are configured to control stiffness of the electroactive polymer transducer.

19. A marine device comprising:
a body, wherein the marine device is configured such that a portion of the body rests above a surface level of water when the marine device floats in the water;
a mechanical energy transmission system configured to convert mechanical energy resulting from a change in the water surface level to mechanical energy regulated by the mechanical energy transmission system;
an electroactive polymer transducer operably coupled to a portion of the mechanical energy transmission system and configured to produce electrical energy using the regulated mechanical energy in the mechanical energy transmission system, the electroactive polymer transducer including an electroactive polymer and one or more electrodes coupled to the electroactive polymer; and
conditioning electronics in electrical communication with the at least two electrodes and designed or configured to add or remove electrical energy from the electroactive polymer transducer.

20. The marine device of claim 19 wherein the conditioning electronics are designed or configured to perform one of the following functions: voltage step-up, voltage step-down and charge control.

21. The marine device of claim 19 wherein the conditioning electronics include an inductive circuit including at least one inductor and configured to harvest electrical energy from the electroactive polymer for each stroke of the electroactive polymer.

22. The marine device of claim 21 further comprising one or more switches that are each configured to indicate a stroke position of the electroactive polymer transducer.

23. The marine device of claim 22 wherein one of the switches is configured to indicate an extreme stroke position of the electroactive polymer transducer.

24. The marine device of claim 19 wherein the conditioning electronics include a capacitive circuit including at least one capacitor and configured to harvest electrical energy from the electroactive polymer for each stroke of the electroactive polymer.

25. The marine device of claim 19 wherein the mechanical energy transmission system includes an energy storage mass that is configured to move relative to the body in response to a water surface level change that causes movement of the body relative to the water surface level.

26. A method of generating electrical energy in a marine device including a body, the method comprising:
floating the marine device, wherein the marine device is configured such that a portion of the body rests above a water surface level when the marine device floats on the water;
transmitting mechanical energy from a water surface level change to an electroactive polymer transducer; and
generating electrical energy using the electroactive polymer transducer, wherein the electroactive polymer transducer includes an electroactive polymer and one or more electrodes coupled to the electroactive polymer.

27. The method of claim 26 wherein transmitting the mechanical energy from the water surface level change to the electroactive polymer transducer includes moving an energy storage mass relative to the marine device body in response to the water surface level change.

28. The method of claim 27 wherein the electroactive polymer transducer is configured to contribute a stiffness to the energy storage mass.

29. The method of claim 28 further comprising changing stiffness for the electroactive polymer transducer to provide a resonant frequency for the energy storage mass and spring within about 1 Hertz of a resonant frequency for the marine device.

30. The method of claim 26 wherein the energy storage mass moves in a direction opposite to a direction of displacement for the body when the water surface level changes.

31. The method of claim 26 further comprising deflecting the electroactive polymer transducer using the transmitted mechanical energy.

32. The method of claim 31 further comprising adding electrical energy to the electroactive polymer transducer before the deflection.

33. The method of claim 32 wherein generating electrical energy using the electroactive polymer transducer includes removing electrical energy from the electroactive polymer transducer as the electroactive polymer transducer contracts.

34. The method of claim 33 wherein the total electrical energy removed from the electroactive polymer transducer is greater than the total electrical energy added to the electroactive polymer transducer in a cycle and wherein a net amount of electrical energy is output from the electroactive polymer transducer.

35. The method of claim 26 further comprising sensing position of the electroactive polymer transducer.

* * * * *